(12) United States Patent
Huang et al.

(10) Patent No.: US 12,014,885 B2
(45) Date of Patent: Jun. 18, 2024

(54) MOLECULAR DOPING ENABLED SCALABLE BLADING OF EFFICIENT HOLE TRANSPORT LAYER-FREE PEROVSKITE SOLAR CELLS

(71) Applicant: NUtech Ventures, Lincoln, NE (US)

(72) Inventors: Jinsong Huang, Chapel Hill, NC (US); Wuqiang Wu, Chapel Hill, NC (US)

(73) Assignee: NUtech Ventures, Inc., Lincoln, NE (US)

( * ) Notice: Subject to any disclaimer, the term of this patent is extended or adjusted under 35 U.S.C. 154(b) by 0 days.

(21) Appl. No.: 16/393,111

(22) Filed: Apr. 24, 2019

(65) Prior Publication Data

US 2019/0326065 A1    Oct. 24, 2019

Related U.S. Application Data

(60) Provisional application No. 62/661,891, filed on Apr. 24, 2018.

(51) Int. Cl.
*H10K 71/15* (2023.01)
*H01G 9/20* (2006.01)
*H10K 71/30* (2023.01)

(52) U.S. Cl.
CPC .......... *H01G 9/2059* (2013.01); *H10K 71/15* (2023.02); *H10K 71/30* (2023.02)

(58) Field of Classification Search
None
See application file for complete search history.

(56) References Cited

U.S. PATENT DOCUMENTS

| | | | | |
|---|---|---|---|---|
| 2012/0319090 A1* | 12/2012 | Shinkai | .................. | H05B 33/10 257/40 |
| 2017/0186559 A1* | 6/2017 | Zhu | ....................... | H01G 9/2013 |
| 2020/0176618 A1* | 6/2020 | Ahn | ................ | H01L 31/022425 |

FOREIGN PATENT DOCUMENTS

DE      2942826      * 11/2015

OTHER PUBLICATIONS

Deng et al. Scalable Fabrication of Efficient Organolead Trihalide Perovskite Solar Cells with Doctor-Bladed Active Layers, Energy Environ. Sci, 2015, 1544-1550 (Year: 2015).*

Levchuk et al. Deciphering the Role of Impurities in Methylammonium Iodide and Their Impact on the Performance of Perovskite Solar Cells, 2016, Advanced Materials Interfaces, 3, 1600593. (Year: 2016).*

Xiao et al. Unraveling the Hidden Function of a Stabilizer in a Precursor in Improving Hybrid Perovskite Film Morphology for High Efficiency Solar Cells, Energy & Environmental Science, 2016, 9, 867 (Year: 2016).*

* cited by examiner

*Primary Examiner* — Bach T Dinh

(74) *Attorney, Agent, or Firm* — Gerald T. Gray; Leydig, Voit & Mayer, LTD.

(57) ABSTRACT

A method of forming a photoactive device includes steps of: forming a photoactive layer, the photoactive layer comprising a perovskite material and a dopant; wherein the photoactive device comprises a positive electrode and a negative electrode; wherein said photoactive layer is directly or indirectly in electronic communication with the positive electrode and directly or indirectly in electronic communication with the negative electrode; and wherein the photoactive device is free of a hole transport layer between the photoactive layer and the positive electrode.

17 Claims, 17 Drawing Sheets

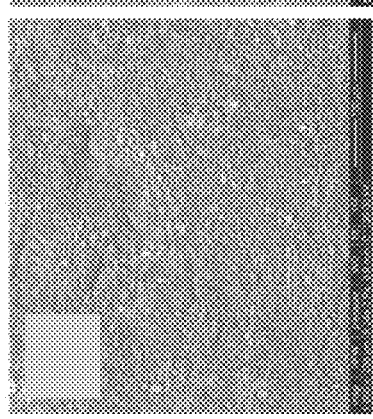
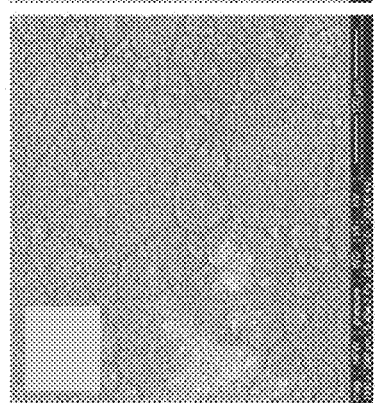
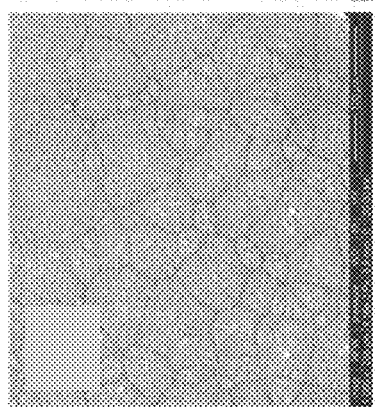
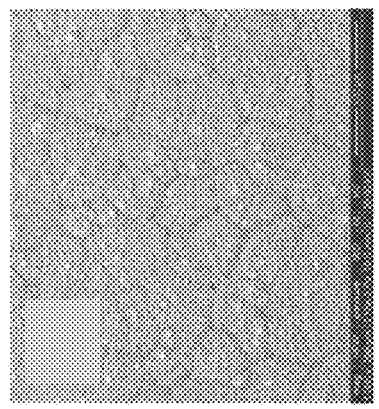
FIG. 7A  FIG. 7B  FIG. 7C  FIG. 7D
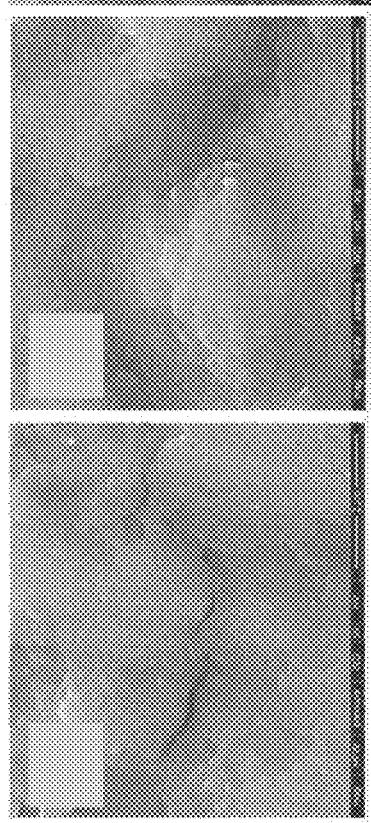
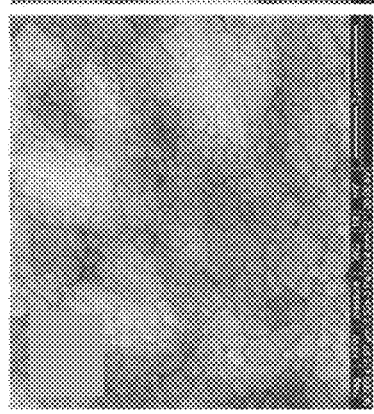
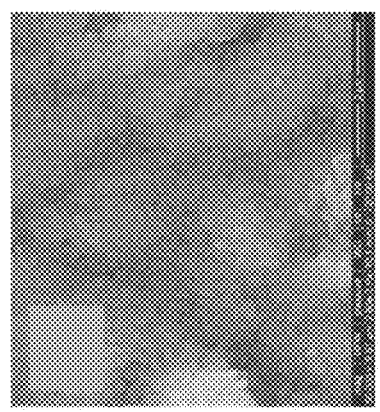
FIG. 7E  FIG. 7F  FIG. 7G  FIG. 7H

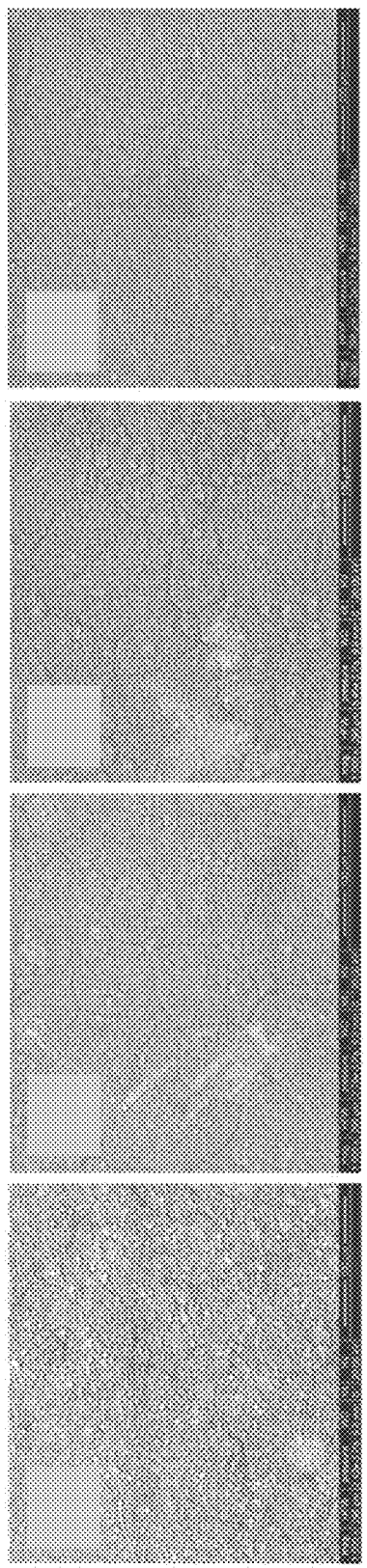
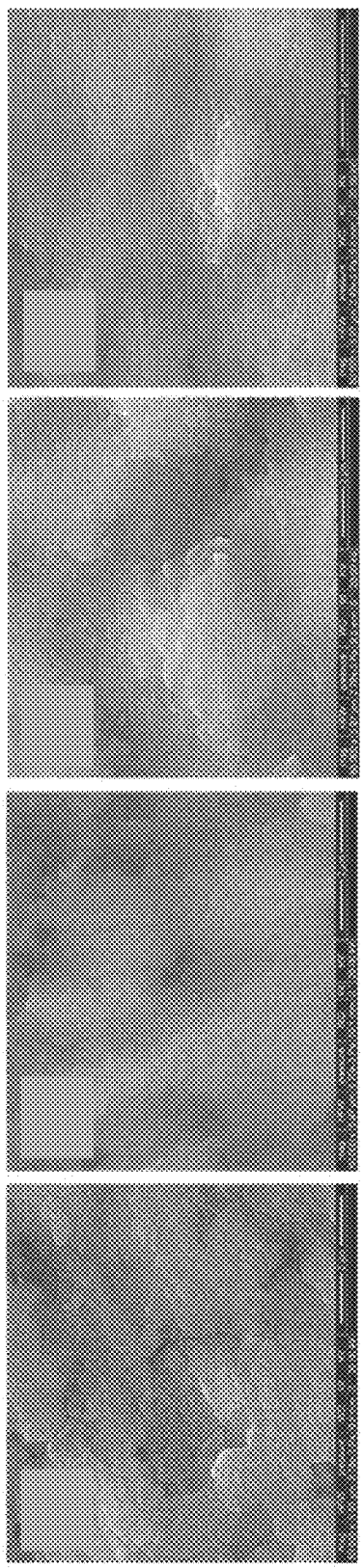
FIG. 9A  FIG. 9B  FIG. 9C  FIG. 9D  FIG. 9E  FIG. 9F  FIG. 9G  FIG. 9H

MOLECULAR DOPING ENABLED SCALABLE BLADING OF EFFICIENT HOLE TRANSPORT LAYER-FREE PEROVSKITE SOLAR CELLS

CROSS-REFERENCE TO RELATED APPLICATIONS

This application claims the benefit of priority to U.S. Provisional Patent Application No. 62/661,891, filed Apr. 24, 2018, which is hereby incorporated by reference in its entirety.

STATEMENT REGARDING FEDERALLY SPONSORED RESEARCH OR DEVELOPMENT

This invention was made with government support under N00014-15-1-2713 awarded by the Office of Naval Research. The government has certain rights in the invention.

BACKGROUND

Perovskite materials have demonstrated or are envisioned to have applicability and advantageous over other conventional materials in a wide array of applications. Applications that stand to benefit from use of perovskite material include electronic devices, such as photoactive devices including solar cells and light emitting diodes (LEDs). Since their first report in 2009, halide perovskite solar cells (PSCs), for example, have attracted interest as light-to-electricity conversion optoelectronic devices with both high-efficiency and ease of solution processability, with research-scale photoconversion efficiencies above 20%. The efficiencies of perovskite solar cells demonstrated in research efforts are now reaching such consistently high levels but scalable manufacturing at low cost is increasingly important for the success for commercial implementation. This remains challenging however due to difficulties associated with the scalable deposition of functional layers including the photoactive layer and the hole transport layer, for example, as well as the expensive hole-transporting materials usually employed.

The challenges of cost and scalability, which are interconnected, of course, are difficult to address. For example, all top-performing PSCs were fabricated by a spin-coating method which is unsuitable for high throughput and scalable module production. Additionally, the conventional hole transport layer used for high efficiency PSCs are expensive, such as, 2,2',7,7'-Tetrakis[N,N-di(4-methoxyphenyl)amino]-9,9'-spirobifluorene (spiro-OMeTAD), difficult to deposit by scalable coating methods, or both.

Addressing these challenges with new device configurations and methods for making such device could reduce the number manufacturing steps and reduce the overall manufacturing cost, thereby facilitating the commercial success of photoactive devices employing perovskite materials.

SUMMARY OF THE INVENTION

The photoactive devices, and associated methods, provided herein address a variety of challenges in the art, including those mentioned above. For example, the photoactive devices describe herein include a simplified configuration by eliminating the hole transport layer, with respect to conventional photoactive device configurations with perovskite materials. However, eliminating the hole transport layer may not be enough to provide for high efficiency devices due to charge transport issues at the interface of a perovskite-containing photoactive layer and a positive electrode, such as ITO, for example. Accordingly, the photoactive devices, and associated methods, described herein, further provide for new photoactive material compositions, including a perovskite material and a dopant (or, a doped perovskite material). These new devices consistently and reproducibly achieve high efficiencies. Furthermore, these photoactive devices, or at least the photoactive layers thereof, are formed by scalable manufacturing techniques, including continuous-type coating methods, such as doctor blading.

In an aspect, provided herein are methods of forming a photoactive device, the methods comprising steps of: forming a photoactive layer, the photoactive layer comprising a perovskite material and a dopant; wherein the photoactive device comprises a positive electrode and a negative electrode; wherein said photoactive layer is directly or indirectly in electronic communication with the positive electrode and directly or indirectly in electronic communication with the negative electrode; and wherein the photoactive device is free of a hole transport layer between the photoactive layer and the positive electrode. According to certain embodiments, at least a portion of the photoactive layer is in direct physical contact with the positive electrode. According to certain embodiments, the photoactive layer is substantially in direct physical contact with the positive electrode. According to certain embodiments, at least a portion of the photoactive layer is in direct electronic communication with the positive electrode. According to certain embodiments, the photoactive layer is substantially in direct electronic communication with the positive electrode. According to certain embodiments, the perovskite material is doped with the dopant. In an aspect, provided herein are methods of forming a photoactive device, the methods comprising steps of: forming a photoactive layer, the photoactive layer comprising a perovskite material and a dopant; wherein the photoactive device comprises a positive electrode and a negative electrode; wherein said photoactive layer is directly or indirectly in electronic communication with the positive electrode and directly or indirectly in electronic communication with the negative electrode; and wherein at least a portion of the photoactive layer is in direct physical contact with the positive electrode. In an aspect, provided herein are methods of forming a photoactive device, the methods comprising steps of: forming a photoactive layer, the photoactive layer comprising a perovskite material and a dopant; wherein the photoactive device comprises a positive electrode and a negative electrode; wherein said photoactive layer is directly or indirectly in electronic communication with the positive electrode and directly or indirectly in electronic communication with the negative electrode; and wherein at least a portion of the photoactive layer is in direct electronic communication with the positive electrode.

According to certain embodiments, the step of forming comprises doping the perovskite material with the dopant by direct mixing, solid diffusion, or a combination of these. According to certain embodiments, the step of forming comprising coating a perovskite-dopant solution onto a receiving surface of a substrate, wherein the perovskite-dopant solution comprises at least a perovskite ink and a dopant. At least one of the substrate and the receiving surface of the substrate may be at least a portion of the positive electrode. According to certain embodiments, the method comprises preparing the perovskite-dopant solution by combining at least: the perovskite ink, the dopant, and one or more solvents. According to certain embodiments, the step of coating comprising coating via a continuous-type coating method. According to certain embodiments, the step of coating comprising doctor blading. According to certain embodiments, doping by solid diffusion comprises providing a perovskite material free of the dopant in proximity with a solid dopant material and allowing the solid dopant material to diffuse into the perovskite material. According to certain embodiments, step of forming further comprises solvent annealing the photoactive layer. According to certain embodiments, the substrate is heated to a temperature selected from the range of 100-150° C. during the step of coating. According to certain embodiments, a concentration of at least one perovskite precursor in the perovskite ink and/or in the perovskite-dopant solution is at least 0.01 M, at least 0.1 M, at least 1 M, selected from the range of 0.01 M to 50 M, selected from the range of 0.01 M to 20 M, selected from the range of 0.01 M to 10 M, selected from the range of 0.1 M to 10 M, selected from the range of 0.1 to 5 M, selected from the range of 1 M to 50 M, or selected from the range of 1 M to 10 M.

According to certain embodiments, a concentration of the dopant in the photoactive layer is selected from the range of 0.01 wt. % to 0.05 wt. %. According to certain embodiments, a concentration of the dopant in the photoactive layer is selected less than or equal to 10 at. % (atomic %), less than or equal to 5 at. %, less than or equal to 1 at. %, less than or equal to 0.1 at. %, less than or equal to 0.01 at. %, less than or equal to 0.001 at. %, selected from the range of 0.001 at. % to 10 at. %, or any value or range therebetween inclusively, selected from the range of 0.001 at. % to 1 at. %, or optionally for some embodiments selected from the range of 0.01 at. % to 1 at. %. According to certain embodiments, a concentration of the dopant in the photoactive layer is less than or equal to 10 wt. % (weight %), less than or equal to 5 wt. %, less than or equal to 1 wt. %, less than or equal to 0.1 wt. %, less than or equal to 0.01 wt. %, less than or equal to 0.001 wt. %, selected from the range of 0.001 wt. % to 10 wt. %, or any value or range therebetween inclusively, selected from the range of 0.001 wt. % to 1 wt. %, or optionally for some embodiments selected from the range of 0.01 wt. % to 1 wt. %. According to certain embodiments, a concentration of the dopant in the perovskite-dopant solution is selected from the range of 0.01 wt. % to 0.05 wt. %. According to certain embodiments, a concentration of the dopant in the photoactive layer is selected less than or equal to 10 at. % (atomic %), less than or equal to 5 at. %, less than or equal to 1 at. %, less than or equal to 0.1 at. %, less than or equal to 0.01 at. %, less than or equal to 0.001 at. %, selected from the range of 0.001 at. % to 10 at. %, or any value or range therebetween inclusively, selected from the range of 0.001 at. % to 1 at. %, selected from the range of 0.01 at. % to 1 at. %. According to certain embodiments, a concentration of the dopant in the perovskite-dopant solution is less than or equal to 10 wt. % (weight %), less than or equal to 5 wt. %, less than or equal to 1 wt. %, less than or equal to 0.1 wt. %, less than or equal to 0.01 wt. %, less than or equal to 0.001 wt. %, selected from the range of 0.001 wt. % to 10 wt. %, or any value or range therebetween inclusively, selected from the range of 0.001 wt. % to 1 wt. %, or optionally for some embodiments selected from the range of 0.01 wt. % to 1 wt. %.

According to certain embodiments, each of the positive electrode and the negative electrode is an electrical conductor. According to certain embodiments, the positive electrode is a transparent electrical conductor. According to certain embodiments, the positive electrode is a transparent conductive oxide, such as, but not limited to, indium tin oxide (ITO) and/or fluorine-doped tin oxide (FTO).

According to certain embodiments, the perovskite-dopant solution comprises one or more additives. According to certain embodiments, the one or more additives are selected from the group consisting of methylammonium hypophosphite (MHP), methylammonium chloride (MACl), and a combination of these. According to certain embodiments, a total concentration of the one or more additives in the perovskite-dopant solution is selected from the range of 0.075 wt. % to 0.8 wt. %, or preferably for some applications selected from the range of 0.01 wt. % to 10 wt. %, or any value or range therebetween. According to certain embodiments, a total concentration of the one or more additives in the perovskite-dopant solution is selected from the range of 0.01 wt. % to 1 wt. %, or is less than 0.1 wt. %. According to certain embodiments, an additive comprises the element chlorine.

According to certain embodiments, the perovskite ink comprises one or solvents selected from the group consisting of N,N-diethylformamide (DMF), dimethyl sulfoxide (DMSO), chlorobenzene (CBZ), formamide, dimethylacetamide (DMAc), N-methylformamide, N-methyl-2-pyrrolidone (NMP), N-vinylacetamide, N-vinylpyrrolidone, gamma-Butyrolactone (GBL), 2-Methoxyethanol, and any combination thereof.

According to certain embodiments, the perovskite material is characterized by a chemical formula comprising at least two chemical species selected from the group consisting of Pb, Sn, Sb, Fe, Ge, Mn, Mo, Ta, Ag, Na, K, Ru, Cs, formamidinium ("FA"), methylammonium ("MA"), ethylammonium, propylammonium, butylammonium, amylammonium, hexylammonium, heptylammonium, octylammonium, oleylammonium, formamidinium, dodecylammonium, phenylethylammonium, benzylammonium, ethylenediammonium, tetramethylammonium, tetraethylammonium, tetrabutylammonium, hexadecyl trimethyl ammonium, and ethanediammonium, and at least one chemical species selected from the group consisting of I, Br, Cl, F, COO, BF3 and SCN.

According to certain embodiments, the photoactive layer is characterized by a thickness selected from the range of 0.1 to 2 μm. In any embodiment, the photoactive layer may be a thin film characterized by a thickness selected from the range of 2 nm to 10 μm. In any embodiment of the perovskite materials and methods disclosed herein, the perovskite material be in the form of a thin film characterized by a thickness selected from the range of 2 nm to 10 μm. In some embodiments, the thin film has a thickness selected from the range of 2 nm to 1 μm, preferably for some applications 10 nm to 800 nm, preferably for some applications 100 nm to 700 nm. According to certain embodiments, the photoactive layer comprises crystalline grains characterized by a physical dimension (e.g., diameter, width, thickness) selected from the range of 800 nm to 1700 nm, selected from the range of 100 nm to 2000 nm, selected from the range of 500 nm to 2000 nm, selected from the range of 1000 nm to 2000 nm, selected from the range of 1000 nm to 5000 nm, preferably for some applications at least 100 nm, preferably for some applications, at least 500 nm, or preferably for some applications, preferably for some applications at least 1000 nm, selected from the range of 100 nm to 5000 nm, or any value or range therebetween inclusively. According to certain embodiments, the photoactive layer comprises crystalline grains characterized by an average physical dimension (e.g., diameter, width, thickness) selected from the range of 800 nm to 1700 nm, selected from the range of 100 nm to 2000 nm, selected from the range of 500 nm to 2000 nm, selected from the range of 1000 nm to 2000 nm, selected from the range of 1000 nm to 5000 nm, preferably for some applications at least 100 nm, preferably for some applications, at least 500 nm, or preferably for some applications, preferably for some applications at least 1000 nm, selected from the range of 100 nm to 5000 nm, or any value or range therebetween inclusively.

According to certain embodiments, the photoactive device comprises an electron transport layer between the photoactive layer and the negative electrode. According to certain embodiments, the photoactive device is in indirect electronic communication with the negative electrode via at least one electron transport layer. According to certain embodiments, the electron transport layer comprises $C_{60}$ and/or bathocuproine.

According to certain embodiments, the photoactive device is a photovoltaic cell. According to certain embodiments, an average photovoltaic efficiency of the photoactive device is greater by a factor of 1.8 to 2.2 times than an average photovoltaic efficiency of an otherwise equivalent photovoltaic cell free of the dopant. According to certain embodiments, an average photovoltaic efficiency of the photoactive device is greater by a factor of 1.5 to at least 2, a factor of 1.5 to at least 3, a factor of 1.5 to at least 5, a factor of 2 to at least 3, or preferably for some applications a factor of 2 to at least 5 times than an average photovoltaic efficiency of an otherwise equivalent photovoltaic cell free of the dopant. According to certain embodiments, the average photovoltaic efficiency of the photoactive device corresponds to the average photovoltaic efficiency of at least 3 equivalent devices, at least 5 equivalent devices, at least 10 equivalent devices, at least 15 equivalent devices, or preferably for some applications at least 30 equivalent devices.

In an aspect, provided herein are photoactive device comprising: a negative electrode and a positive electrode; a photoactive layer in electronic communication with the positive electrode and in electronic communication with the negative electrode; wherein the photoactive layer comprises a perovskite material and a dopant; wherein the photoactive device is free of a hole transport layer between the photoactive layer and the positive electrode. According to certain embodiments, at least a portion of the photoactive layer is in direct physical contact with the positive electrode. According to certain embodiments, the photoactive layer is substantially in direct physical contact with the positive electrode. According to certain embodiments, at least a portion of the photoactive layer is in direct electronic communication with the positive electrode. According to certain embodiments, the photoactive layer is substantially in direct electronic communication with the positive electrode. According to certain embodiments, the perovskite material is doped with the dopant. According to certain embodiments, the photoactive layer is disposed between the negative electrode and the positive electrode. According to certain embodiments, the photoactive device comprises an electron transport layer between the photoactive layer and the negative electrode. According to certain embodiments, the photoactive device is a photovoltaic cell.

Also provided herein are methods for forming a photoactive device including any one or any combination of embodiments of methods and photoactive devices disclosed herein. Also provided herein are photoactive devices including any one or any combination of embodiments of methods and photoactive devices disclosed herein. For example, provided herein are perovskite-comprising photovoltaic cells as substantially described herein. For example, provided herein are methods of fabricating a perovskite solar cell as substantially described herein. Also, provided herein are methods for forming a layer comprising a perovskite material including any one or any combination of embodiments of methods and photoactive devices disclosed herein. Also, provided herein are layers comprising a perovskite material including any one or any combination of embodiments of methods and photoactive devices disclosed herein.

BRIEF DESCRIPTION OF THE DRAWINGS

FIG. 1A. Schematic illustration of a doctor-bladed perovskite film and the chemical structure of F4TCNQ dopant. FIG. 1B. Cross-sectional SEM image of the $MAPbI_3$ film deposited directly onto ITO glass via blade coating at 150° C., showing the film thickness of around 500 nm. Topography KPFM images of (FIGS. 1C and 1F) $MAPbI_3$, (FIGS. 1D and 1G) F4TCNQ-doped $MAPbI_3$ and (FIGS. 1E and 1H) F4TCNQ solid-diffused $MAPbI_3$ films. Note: CPD represents the contact potential difference between the tip and sample's surface. FIG. 1I. Surface potential profiles of different perovskite films as indicated. FIG. 1J. Schematic illustration of the energy diagram and electron transfer process for $MAPbI_3$:F4TCNQ blends.

FIG. 2A. Geometry for the lateral conductivity measurement: the perovskite films were 500 nm thick, with 1 mm gold (Au) electrodes separated by 100 µm. FIG. 2B. J-V curves of neat or F4TCNQ-doped $MAPbI_3$ deposited on normal glass substrates, where the current is measured along the lateral direction. FIG. 2C. TPRL decay curves of glass/$MAPbI_3$ and glass/$MAPbI_3$:F4TCNQ. PL lifetimes are calculated by single exponential fitting. FIG. 2D. c-AFM setup. Topographic AFM images of (FIG. 2E) $MAPbI_3$ and (FIG. 2G) $MAPbI_3$:F4TCNQ films, with locations where the c-AFM tip measured the grain and GB currents. Local dark currents measured at the GBs and on the grains for the (FIG. 2F) $MAPbI_3$ film and (FIG. 2H) $MAPbI_3$:F4TCNQ film.

(FIG. 3A) Low magnification and (FIG. 3B) High magnification SEM images of bladed and doped $MAPbI_3$ film prepared with MHP (0.225 wt %) and MACL (0.5 wt %) as additive, followed by co-solvent annealing treatment. FIG. 3C. Schematic illustration of a photoactive device, such as a photovoltaic cell free of a hole transport layer, according to certain embodiments. (FIG. 3D) J-V characteristics, (FIG. 3E) Steady-state current and stabilized PCE measured at a maximum power point (0.93 V), (FIG. 3F) EQE and integrated current density, and (FIG. 3G) PCE histogram of PSCs based on $MAPbI_3$:F4TCNQ films. Dashed arrows in FIG. 3F point toward the respective y-axis, or dependent variable axis, for each data set.

FIGS. 7A-7H. F4TCNQ dopant concentration optimization. SEM images of bladed MAPbI$_3$ films prepared with different amounts of F4TCNQ: (FIGS. 7A and 7E) 0.01 wt %, (FIGS. 7B and 7F) 0.02 wt %, (FIGS. 7C and 7G) 0.03 wt %, and (FIGS. 7D and 7H) 0.05 wt %.

FIGS. 9A-9H. MHP additive concentration optimization. SEM images of bladed MAPbI$_3$ films prepared with 0.03 wt % F4TCNQ and different amounts of MHP: (FIGS. 9A and 9E) 0.075 wt %, (FIGS. 9B and 9F) 0.150 wt %, (FIGS. 9C and 9G) 0.225 wt %, and (FIGS. 9D and 9G) 0.300 wt %. Increasing the MHP concentration in the precursor solution can enlargen crystalline grains and enhance crystallinity of for the perovskite films (see FIGS. 9A-9H and FIG. 10).

FIGS. 16B-16F are optional step of the method, according to some embodiments.

STATEMENTS REGARDING CHEMICAL COMPOUNDS AND NOMENCLATURE

Figure 1A:
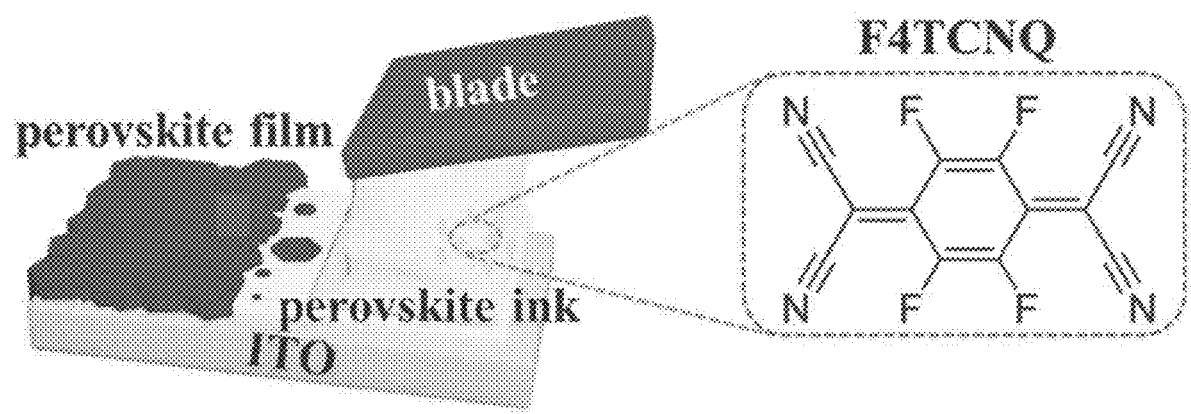
FIGS. 1A-1J. Doctor blading process and doping of perovskite films by F4TCNQ.

In general, the terms and phrases used herein have their art-recognized meaning, which can be found by reference to standard texts, journal references and contexts known to those skilled in the art. The following definitions are provided to clarify their specific use in the context of the present disclosure.

The term "photoactive device" refers to (i) a device capable of and configured to converting electromagnetic radiation (e.g., X-ray, infrared, ultraviolet, and/or visible light) to electrical energy and/or converting electrical energy to electromagnetic radiation. A photoactive device may be configured to both convert light to electrical energy (e.g., as a solar cell) and convert electrical energy to light (e.g., via electroluminescence), for example depending on the direction of electrical current in the device (e.g., depending on whether electrical power is withdrawn from or supplied to the device). Accordingly to certain embodiments, a photoactive device may be referred to as an optoelectronic device. Exemplary photoactive devices include, but are not limited to, a photovoltaic cell (also referred to as a solar cell), a photodiode, and a light emitting diode (LED). In some embodiments, a photoactive device may also refer to a device configured to change its optical, physical, and/or electrical properties with change in its exposure to electromagnetic radiation and/or a device configured to change its optical properties in response to a change in input of electrical energy. Exemplary photoactive devices may also include, but are not limited to, a photoresistor, phototransistor, photomultiplier, photoelectric cell, and an electrochromic cell.

The term "photoactive layer" refers to a layer, of a photoactive device, which absorbs the photons that are converted to electrical energy or which emits the photons which are formed in response to input electrical energy. In some embodiments, a photoactive layer is the layer of a photoactive device which absorbs photons and exhibits a change in at least property, such as resistance of the photoactive layer. In a photovoltaic cell, a photoactive layer may also be referred to as an absorber layer and/or an active layer. A photoactive device may have more than one photoactive layer. In some embodiments, a photoactive layer of a photoactive device is a perovskite layer, or layer including a perovskite material. The photoactive layer may be have one or a variety of configurations acceptable for its function in the photoactive device, including, but not limited to, 1D, 2D, and/or 3D configurations, and including, but not limited to, a thin film, an array or assembly of crystals (e.g., nanocrystals), and/or an array or assembly of nanowires, nanorods, and/or microwires.

The term "active area" refers to an area of a photoactive device. In the case of a photoactive device that is converting electromagnetic radiation to electrical energy, the active area refers to the area of the device that is exposed to and absorbs the photons which are converted to electrical energy. In the case of a photoactive device that is converting electrical energy to electromagnetic radiation, the active area refers to the area of the device that is emitting electromagnetic radiation induced by the electrical energy put into the device. In some embodiments, the area refers to a surface area. The active area of a photoactive device, such as of a photovoltaic cell, may be measured by any conventional technique used in the art to measure the active area of a photoactive device, including techniques known by those of skill in the art of photovoltaics. In some embodiments, the active area corresponds to the area of an aperture when an aperture is used to limit the area of the photoactive device that is exposed to incident electromagnetic radiation, for conversion of electromagnetic radiation to electrical energy. For example, an area of a photovoltaic cell may be 100 cm$^2$ (e.g., area corresponding to the area capable of absorbing electromagnetic radiation and converting it to electrical energy), but an aperture is positioned between the photovoltaic cell and the incident light source to limit the light-exposed-area of the photovoltaic cell to an area of 50 cm$^2$, such that the active area of this photovoltaic cell is 50 cm$^2$ rather than 100 cm$^2$. (An aperture may be used to limit the illuminated area to minimize edge effects and other artifacts, for example.) In some embodiments, a plurality of individual photovoltaic cells are exposed to incident light through an aperture area, but only a select one or more of the light-exposed photovoltaic cells produce electrical energy or have its produced electrical energy measured via an electrical circuit external to the photovoltaic cell (e.g., an individual cell is connected to a circuit and is actively flowing charge carriers (electrical current) among the anode, an electrical circuit, and cathode). For example, a total of 17 photovoltaic cells, each individual cell having an area of 1.95 cm$^2$, may be exposed to incident light (optionally through an aperture) such that a total area of illuminated photovoltaic cells is 33.0 cm$^2$, where the active area of each individual photovoltaic cell is 1.95 cm$^2$. For example, a total of 16 photovoltaic cells, each individual cell having an area of 3.575 cm$^2$, may be exposed to incident light (optionally through an aperture) such that a total area of illuminated photovoltaic cells is 57.2 cm$^2$, where the active area of each individual photovoltaic cell is 3.575 cm$^2$. In some embodiments, a plurality of individual photovoltaic cells are illuminated simultaneously and are electrically connected (e.g., in series or parallel) such that electrical energy is extracted from the plurality of individual photovoltaic cells simultaneously; in this case, the active area corresponds to the sum of the active areas of each of the plurality of individual cells. In some embodiments, the active area refers to the device area that undergoes change in optical, physical, and/or electrical properties with change in its exposure to electromagnetic radiation or the device area that undergoes change in optical properties in response to a change in input of electrical energy (e.g., the portion of the electrochemical cell undergoing change in color in response to voltage). In some embodiments, the active area of a photoactive device is 0.1 cm$^2$±0.05 cm$^2$. In some embodiments, the active area of a photoactive device is selected from the range of 0.1 cm$^2$±0.05 cm$^2$ to at least 100 cm$^2$, or any value or range therebetween inclusively, such as 0.1 cm$^2$±0.05 cm$^2$ to at least 1 cm$^2$, or 0.1 cm$^2$±0.05 cm$^2$ to at least 5 cm$^2$.

The terms "power conversion efficiency," "PCE," "photovoltaic efficiency", and "solar cell efficiency," may be used interchangeably and refer to the ratio of energy output from the photovoltaic device to the energy input to the photovoltaic device. The energy output is in the form of electrical energy and energy input is in the form of electromagnetic radiation (e.g., sunlight). Unless otherwise indicated, the photovoltaic efficiency refers to terrestrial photovoltaic efficiency, corresponding to AM1.5 conditions, where AM is Air Mass. PCE may be measured by one or more techniques conventionally known to one of ordinary skill in the art.

The term "illumination equivalent to 1 sun" refers to an illumination (radiation) intensity and/or electromagnetic spectrum of illumination that substantially approximates or is substantially equivalent to terrestrial solar intensity and/or electromagnetic spectrum. Preferably for some applications illumination equivalent to 1 sun refers to a light intensity, or power density, of at least 70±10 mW/cm$^2$, preferably for some applications at least 70 mW/cm$^2$, preferably for some applications 100±20 mW/cm$^2$, and more preferably for some applications 100±10 mW/cm$^2$. Preferably for some applications illumination equivalent to 1 sun refers to (i) illumination characterized by an electromagnetic spectrum corresponding substantially to the global standard spectrum AM1.5G, where AM refers to air mass. Preferably for some applications illumination equivalent to 1 sun refers to a light intensity, or power density, of at least 70±10 mW/cm$^2$, preferably for some applications at least 70 mW/cm$^2$, preferably for some applications 100±20 mW/cm$^2$, and more preferably for some applications 100±10 mW/cm$^2$ and (ii) the illumination being characterized by an electromagnetic spectrum corresponding substantially to the global standard spectrum AM1.5G, where AM refers to air mass. Illumination equivalent to 1 sun may be obtained via a simulated solar spectrum using equipment and techniques known in the art and available to one of skill in the art.

The term "photocurrent hysteresis" (sometimes referred just as "hysteresis" in refers to a current-vs.-voltage performance of a photoactive device) refers to a difference between photocurrent of a photoactive device, such as a solar cell, when scanned in a forward direction (e.g., negative voltage bias toward positive voltage bias) versus when scanned in a backward direction (e.g., positive voltage bias toward negative voltage bias).

The term "perovskite material" refers to a material or compound that is characterized by a perovskite crystal structure. A perovskite material may be inorganic, such as, but not limited to, $CsPbI_3$, wherein the chemical formula of the perovskite material does not comprise carbon (C). A perovskite material may be organic-inorganic, such as, but not limited to, $MAPbI_3$ and $Cs_{0.05}FA_{0.81}MA_{0.14}PbI_{2.55}Br_{0.45}$, wherein the chemical formula of the perovskite material comprises organic and inorganic compounds. In any embodiment, the perovskite material may be an inorganic perovskite material, and an organic-inorganic perovskite material, or a combination thereof. In some embodiments, the perovskite material is an organic-inorganic perovskite material. In some embodiment, the perovskite material is an inorganic perovskite material. In any embodiment, the perovskite material may be characterized by a chemical formula comprising at least two chemical species selected from the group consisting of Pb, Sn, Sb, Fe, Ge, Mn, Mo, Ta, Ag, Na, K, Ru, Cs, formamidinium ("FA"), methylammonium ("MA"), ethylammonium, propylammonium, butylammonium, amylammonium, hexylammonium, heptylammonium, octylammonium, oleylammonium, formamidinium, dodecylammonium, phenylethylammonium, benzylammonium, ethylenediammonium, tetramethylammonium, tetraethylammonium, tetrabutylammonium, hexadecyl trimethyl ammonium, and ethanediammonium, and at least one chemical species selected from the group consisting of I, Br, Cl, F, COO, $BF_3$, and SCN.

A "perovskite ink" is a solution comprising at least one solvent and at least one perovskite material or at least one perovskite precursor. A perovskite precursor is a material that alone and/or in combination with one or more other materials forms a perovskite material upon deposition or formation of a layer or film, for example. A perovskite precursor may be a salt. The perovskite precursor is optionally dissolved or otherwise solvated in the perovskite ink, but may also or instead be suspended in the perovskite ink. For example, in order to form a layer of $MAPbI_3$, an exemplary perovskite material, from a perovskite ink, the perovskite ink may include perovskite precursors lead iodide ($PbI_2$) and methylammonium iodide (MAI). The perovskite ink may include other materials, such as one or more additives, which may be present to influence the properties of the perovskite ink, influence the coating process, and/or influence the properties of the layer formed via the perovskite ink. A perovskite-dopant solution is a solution which includes a perovskite ink and further includes a dopant material in the solution.

In some embodiments, the term "dopant" is a term of art in the fields of semiconductors and electronic devices that utilize semiconductors (e.g., photovoltaics). Generally, the term "dopant" refers to a dopant material which is present in a host material, typically in a small amount, and influences the electrical and/or optical properties of the host material. Generally, a dopant may be a material that introduces energy level(s) within a band gap of a semiconductor material (host material), thus influencing the semiconductor material's electrical and/or optical properties. For example, a concentration of a dopant in a host material may be less than or equal to 10 at. % (atomic %), less than or equal to 5 at. %, less than or equal to 1 at. %, less than or equal to 0.1 at. %, less than or equal to 0.01 at. %, less than or equal to 0.001 at. %, or selected from the range of 0.001 at. % to 10 at. %, or any value or range therebetween inclusively, such as 0.001 at. % to 1 at. %, or 0.01 at. % to 1 at. %. For example, a concentration of a dopant in a host material may be less than or equal to 10 wt. % (weight %), less than or equal to 5 wt. %, less than or equal to 1 wt. %, less than or equal to 0.1 wt. %, less than or equal to 0.01 wt. %, less than or equal to 0.001 wt. %, or selected from the range of 0.001 wt. % to 10 wt. %, or any value or range therebetween inclusively, such as 0.001 wt. % to 1 wt. %, or 0.01 wt. % to 1 wt. %. Exemplary dopants and host materials include, but are not limited to, boron in silicon and 2,3,5,6-tetrafluoro-7,7,8,8-tetracyanoquinodimethane ("F4TCNQ") in methylammonium lead iodide ($MAPbI_3$).

Generally, an electrode is an electrical conductor used to make contact with a non-metallic part of a circuit, such an electrical conductor that makes contact with a semiconductor. An electronic device, such as a photoactive device, includes at least one positive electrode and at least one negative electrode. In some embodiments, the term "positive electrode" refers to the electrode into which or toward which electrons flow in an external circuit during normal or primary operation. In an embodiment, normal or primary operation refers to condition of forward bias of a photoactive device, such as a condition of forward bias of a photovoltaic device. A positive electrode may be referred to as the electrode into which or toward which positive charge carriers, such as holes, flow during normal operation, such as positive charges from the photoactive layer within the photoactive device. In some embodiments, a positive electrode is a metal or is metallic. In some embodiments, a positive electrode is a transparent electrical conductor, such as, but not limited to, a transparent conductive oxide (TCO), such as, but not limited to, indium tin oxide (ITO) or fluorine-doped tin oxide (FTO).

According to certain embodiments, the terms "hole transport layer" and "electron transport layer" have art-known definitions in the field of photoactive devices, including photovoltaic cells. The hole transport layer (HTL) may be a layer, or multiple layers, included between a photoactive layer and a positive electrode for the purpose of facilitating extraction of holes, or positive charge carriers, from the photoactive layer to the positive electrode while substantially blocking and/or slowing the transfer of electrons, or negative charge carriers, from the photoactive layer to the positive electrode. The electron transport layer (ETL) may be a layer, or multiple layers, included between a photoactive layer and a negative electrode for the purpose of facilitating extraction of electrons, or negative charge carriers, from the photoactive layer to the negative electrode while substantially blocking and/or slowing the transfer of holes, or positive charge carriers, from the photoactive layer to the negative electrode.

In an embodiment, the term "direct mixing" refers to a process by which a dopant may be introduced to a photoactive layer or a perovskite material thereof. In an embodiment, direct mixing includes forming a perovskite-dopant solution having a dopant in a perovskite ink or a solution including a perovskite ink and a dopant, such that a perovskite material is then formed from the perovskite-dopant solution such that the formed layer having the perovskite material includes the dopant.

In an embodiment, the term "solid diffusion" refers to a process by which a dopant may be introduced to a photoactive layer or a perovskite material thereof. In an embodiment, solid diffusion includes providing a solid or bulk form of a dopant, such as a powder or piece of the dopant (e.g., in bulk form), and allowing the dopant to diffuse into a perovskite material, or layer thereof, for example with the aid of heat.

"Electronic communication" also refers to the ability of two or more materials and/or structures that are capable of transferring charge between them, such as in the form of the transfer of electrons and/or holes. In some embodiments, components in electronic communication are in direct electronic communication wherein an electronic signal or charge carrier is directly transferred from one component to another. In some embodiments, components in electronic communication are in indirect electronic communication wherein an electronic signal or charge carrier is indirectly transferred from one component to another via one or more intermediate structures, materials, films, or other elements, such as circuit elements, separating the components.

The term "continuous-type coating" refers to a coating method compatible with continuous or roll-to-roll film deposition. In some embodiments, a continuous-type coating method refers to a coating method for deposition of solid film(s) from liquid solution(s) and which is compatible with a continuous or roll-to-roll film deposition. In some embodiments, a continuous-type coating method is one that is not a batch-type coating method. Exemplary continuous-type coating methods include, but are not limited to, blade coating (e.g., doctor blade coating), rotogravure coating, die coating, slot die coating, slide die coating, gravure coating, shear coating, spray coating, inkjet printing, curtain coating, bead coating, screen printing, flexographic printing, immersion dip coating, metering rod coating, roller coating, silk screen coating, extrusion coating, slot die bead coating, and any combination thereof. Continuous-type coating methods, including the aforementioned exemplary continuous-type coating methods, may be performed according any one or a variety of art-known coating methods appropriate for the area and/or amount of material being coated. Generally, spin coating is an exemplary batch-type coating method.

The term "ambient air" refers to a gaseous atmosphere that is substantially air having a composition comprising substantially 78% nitrogen and substantially 21% oxygen. In some embodiments, the nitrogen and oxygen concentrations of ambient air is not substantially manipulated artificially or otherwise by human interaction. In some embodiments, ambient air has a temperature that is room temperature. Unless otherwise noted, room temperature refers to a temperature selected from the range of 15° C. to 25° C., or 59° F. to 77° F. Preferably for some embodiments, ambient air has a relative humidify selected from the range of 0% to 80%, preferably for some applications 10% to 80%, preferably for some applications less than 30%, and preferably for some applications 60±10%.

The term "substantially" refers to a property, condition, or value that is within 20%, 10%, within 5%, within 1%, optionally within 0.1%, or is equivalent to a reference property, condition, or value. The term "substantially equal", "substantially equivalent", or "substantially unchanged", when used in conjunction with a reference value describing a property or condition, refers to a value that is within 20%, within 10%, optionally within 5%, optionally within 1%, optionally within 0.1%, or optionally is equivalent to the provided reference value. For example, a concentration is substantially equal to 1 M (or, "is substantially 1 M") if it the value of the concentration is within 20%, optionally within 10%, optionally within 5%, optionally within 1%, within 0.1%, or optionally equal to 1 M. The term "substantially greater", when used in conjunction with a reference value describing a property or condition, refers to a value that is at least 1%, optionally at least 5%, optionally at least 10%, or optionally at least 20% greater than the provided reference value. The term "substantially less", when used in conjunction with a reference value describing a property or condition, refers to a value that is at least 1%, optionally at least 5%, optionally at least 10%, or optionally at least 20% less than the provided reference value.

In an embodiment, a composition or compound of the invention, such as an alloy or precursor to an alloy, is isolated or substantially purified. In an embodiment, an isolated or purified compound is at least partially isolated or substantially purified as would be understood in the art. In an embodiment, a substantially purified composition, compound or formulation of the invention has a chemical purity of 95%, optionally for some applications 99%, optionally for some applications 99.9%, optionally for some applications 99.99%, and optionally for some applications 99.999% pure.

DETAILED DESCRIPTION

In the following description, numerous specific details of the devices, device components and methods of the present embodiments are set forth in order to provide a thorough explanation of the precise nature of the embodiments. It will be apparent, however, to those of skill in the art that the embodiments can be practiced without these specific details.

Without wishing to be bound by any particular theory, there may be discussion herein of beliefs or understandings of underlying principles relating to the devices and methods disclosed herein. It is recognized that regardless of the ultimate correctness of any mechanistic explanation or hypothesis, an embodiment can nonetheless be operative and useful.

The efficiencies of perovskite solar cells (PSCs) are reaching such consistently high levels that scalable manufacturing at low cost is becoming critical. However, this remains challenging due to the expensive hole-transporting materials usually employed, and difficulties associated with the scalable deposition of other functional layers. By simplifying the device architecture, hole transport layer-free PSCs with improved photovoltaic performance are fabricated via a scalable doctor-blading process. Molecular doping of halide perovskite films improved the conductivity of the films and their electronic contact with the conductive substrate, resulting in a reduced series resistance. It facilitates the extraction of photoexcited holes from perovskite directly to conductive substrate. The bladed hole transport layer-free PSCs showed a stabilized power conversion efficiency above 20.0%. The devices and methods disclosed herein are a significant step towards the scalable, cost-effective manufacturing of PSCs with both high performance and simple fabrication processes.

Since their first report in 2009, halide perovskite solar cells (PSCs) have attracted enormous interest as emerging light-to-electricity conversion optoelectronic devices with both high-efficiency and ease of solution processability.[1-3] To date, the power conversion efficiencies (PCEs) of solution-processed PSCs have been certified at well above 20%.[4,5,6] However, all top-performing PSCs were fabricated by a spin-coating method which is unsuitable for high throughput and scalable module production. Several scalable film deposition techniques have been developed for PSC fabrication, such as doctor-blading,[7-10] spray deposition,[11] slot-die coating,[12] solution printing,[13] and electrodeposition.[14] In particular, doctor-blade coating with a controlled substrate temperature has gained most success in depositing high-quality perovskite films with large grains and controllable optoelectronic properties.[15] Moreover, blade coating has great potential to be scaled up for roll-to-roll fabrication. Encouragingly, the PCEs of PSCs with bladed perovskite layers have steadily increased to above 19%, approaching the levels of their spin-coated counterparts.[13,16]

A next step towards the scalable fabrication of PSCs is coating the charge transport layers by scalable processes. However, the existing multiple layer device structures, either p-i-n or n-i-p structures with a hole transport layer (HTL), perovskite, and electron transport layer (ETL), impose a great challenge on the scalable fabrication of PSCs in a cost-effective manner.[17-20] First, high performance organic hole transporting materials, such as 2,2',7,7'-Tetrakis [N,N-di(4-methoxyphenyl)amino]-9,9'-spirobifluorene (spiro-OMeTAD), are much more expensive than perovskite materials. Second, for the devices with p-i-n structure, it is difficult to blade-coat perovskite films onto a hydrophobic HTL, e.g. poly(triaryl amine) (PTAA), while a hydrophilic HTL, e.g. $NiO_x$, is difficult to form on plastic substrates at low temperature, nor can easily be coated at optimal thickness and electronic quality to achieve the highest device efficiency. Hence, the elimination of the HTL from the PSC device architecture can be an effective way to solve this challenge. By reducing one step of the standard coating process, at least one third of the manufacture cost and time can be saved, in addition to savings of material cost for the HTL.

The reported ambipolar charge transport characteristics of halide perovskite materials endow them with great potential to construct PSCs with simplified device architecture, such as HTL-free PSCs with either conventional or inverted structure.[21-23] Yet, a critical challenge for HTL-free PSCs is the ineffective hole collection by indium tin oxide (ITO) because of mismatched work functions between ITO and the perovskite, which generally causes significant efficiency loss.[23-25] In addition, the construction of HTL-free devices by the blade-coating method faces more challenges due to rougher and more non-uniform perovskite films, than do those prepared by spin-coating with the anti-solvent method.

According to an embodiment, a molecular doping strategy is provided for a perovskite layer to doctor-blade HTL-free PSCs with a simplified device structure of ITO/perovskite/ETL/Cu. Doping methylammonium lead iodide ($MAPbI_3$) films with 2,3,5,6-tetrafluoro-7,7,8,8-tetracyanoquinodimethane (F4TCNQ), a strong electron-withdrawing molecule, leads to a modified ITO/$MAPbI_3$ interface with favorable band bending, which facilitates the extraction of photoexcited holes from perovskite to ITO electrode. Combining additive engineering and solvent annealing, high-quality $MAPbI_3$ films are obtained with full surface coverage, micrometer-sized grains, and improved crystallinity. By employing a bladed and doped $MAPbI_3$ film as the photoactive layer in a HTL-free device structure, a stabilized PCE over 20.0% with almost no J-V hysteresis is obtained according to an embodiment.

Perovskite Films Fabrication and Molecular Doping

Figure 1B:
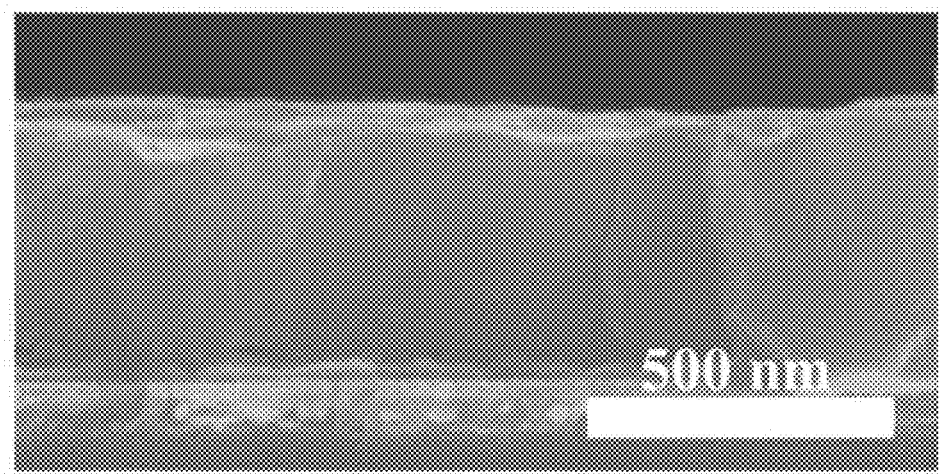

The $MAPbI_3$ perovskite films are directly deposited onto blank ITO glass (an exemplary positive electrode) substrates by a previously reported doctor-blading method,[9] which is schematically illustrated in FIG. 1A. Before blade coating, the ITO substrates are cleaned by a UV-ozone treatment to improve their wettability to perovskite solution.[23] $MAPbI_3$ precursor dissolved in N,N-diethylformamide (DMF) containing p-type dopant (F4TCNQ) is dripped onto substrates which are heated at 150° C., followed by a quick blading process to spread the solution onto the substrates. After blading, the perovskite precursor solution dried in a few seconds, and the substrates are quickly removed from the hotplate for annealing at 100° C. for varied durations. The bladed perovskite films show thicknesses of 500±20 nm from cross-sectional imaging (FIG. 1B) by scanning electron microscopy (SEM). To implement molecular doping of the perovskite layer, F4TCNQ with chemical structure shown in FIG. 1A is dissolved in DMF separately, and then added to the as-prepared $MAPbI_3$ precursor solution. Perovskite films made without or with F4TCNQ are denoted as $MAPbI_3$ or $MAPbI_3$:F4TCNQ, respectively.

Figure 1C:
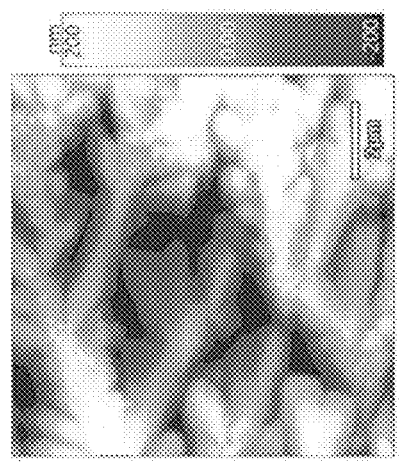
Figure 1D:
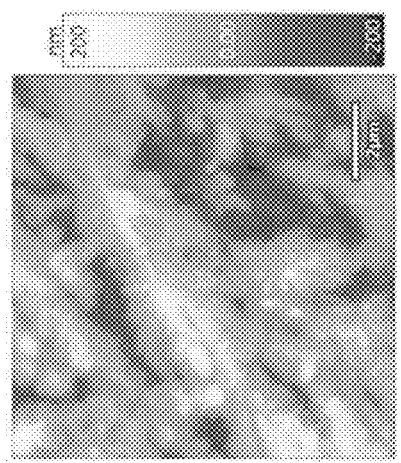
Figure 1E:
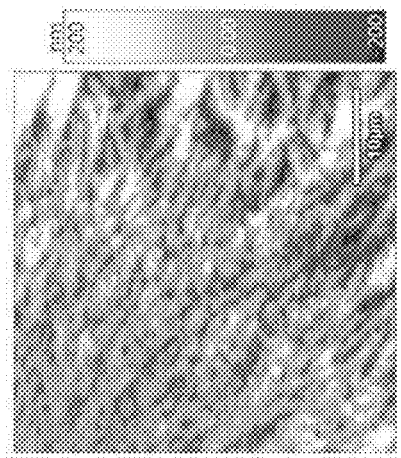
Figure 1F:
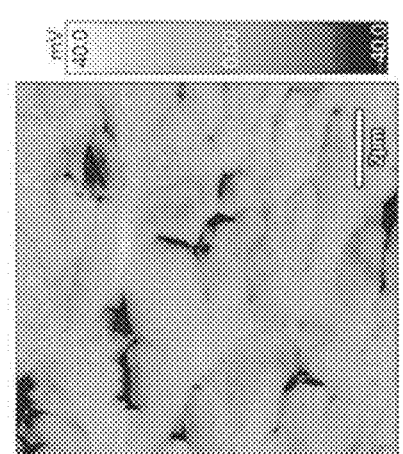
Figure 1G:
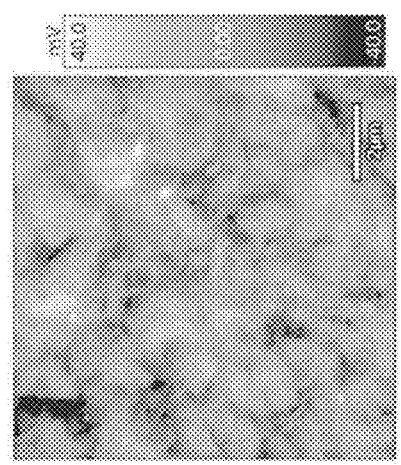
Figure 1H:
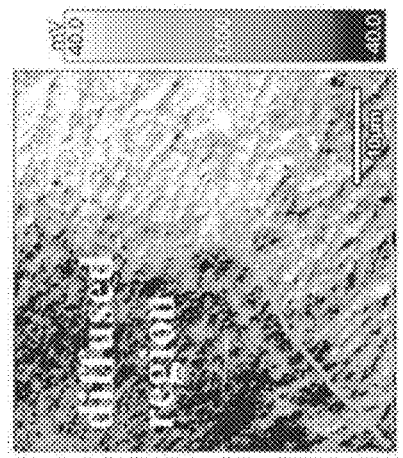
Figure 1I:
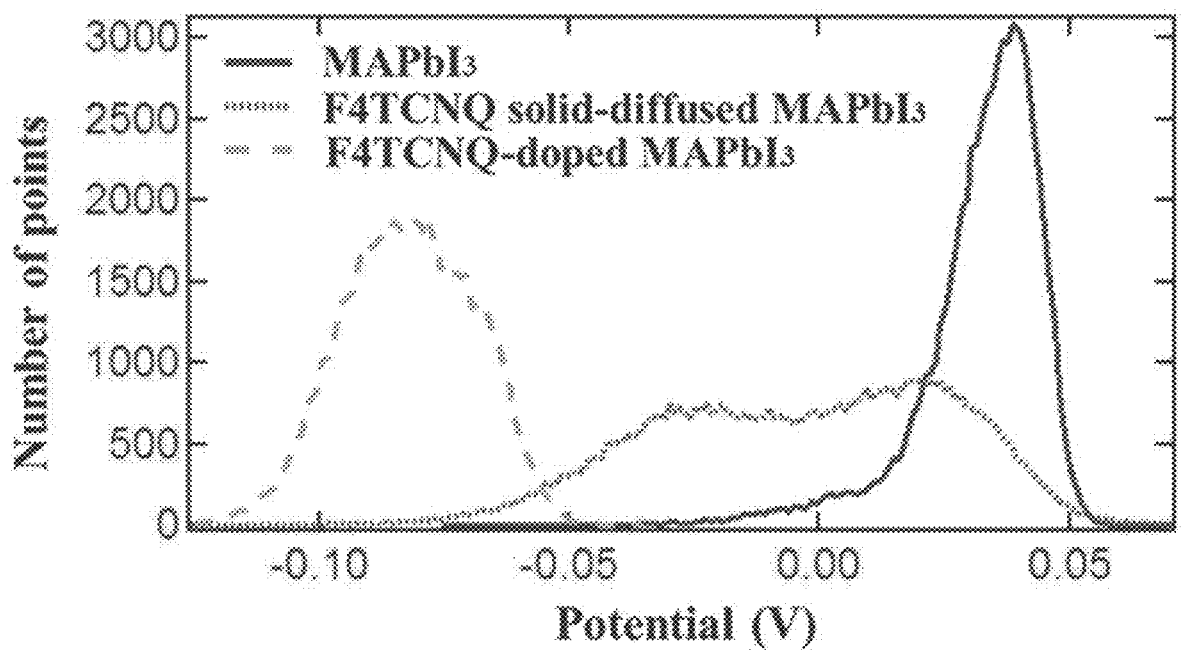
Figure 1J:
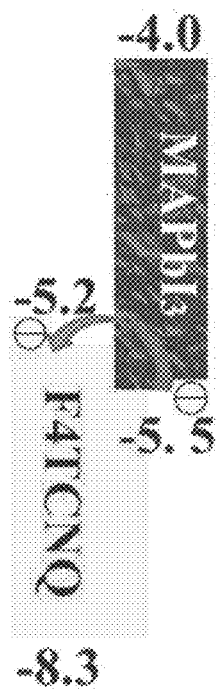
Figure 5:
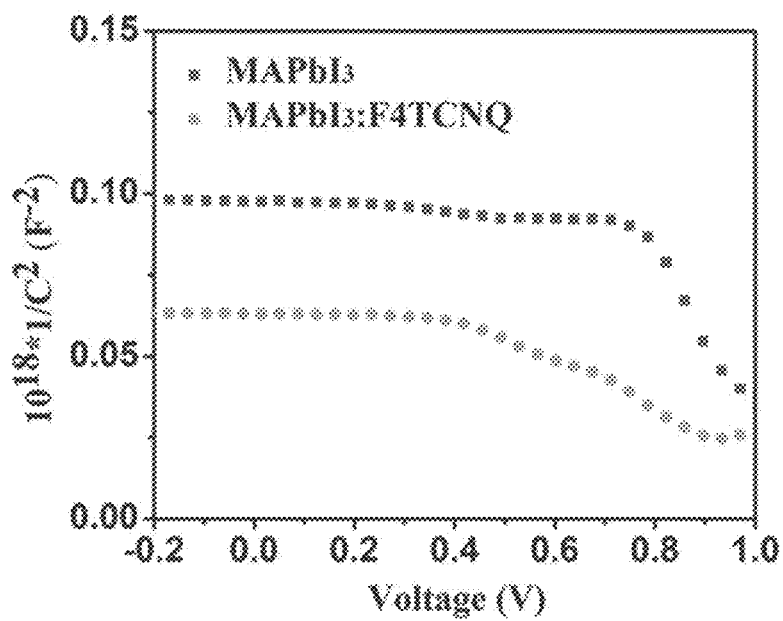
FIG. 5. Carrier concentration characterization. Mott-Schottky plot (dark capacitance versus voltage) of HTL-free PSCs based on $MAPbI_3$ or $MAPbI_3$:F4TCNQ films.

The doping of perovskite changes the work function of the films. Kelvin probe force microscopy (KPFM) was used to determine the surface potential change of perovskite films upon F4TCNQ mixing. In addition to direct mixing of F4TCNQ and $MAPbI_3$ in precursor solution, $MAPbI_3$:F4TCNQ was prepared by solid diffusion via heating F4TCNQ powder on $MAPbI_3$ and then removing the excess F4TCNQ. The topography and contact potential difference (CPD) images of pristine $MAPbI_3$ and $MAPbI_3$:F4TCNQ films by either standard solution mixing or solid diffusion are shown in FIGS. 1C-1H. For better comparison, the three CPD images are flattened and presented in the same color scale, while the histograms of the absolute CPD values of the three types of films are plotted in FIG. 1I. The pure $MAPbI_3$ film has coarse grains and uniform CPD distribution (FIGS. 1C and 1F). In contrast, solution mixed $MAPbI_3$:F4TCNQ film, in which doping can be uniform, has fine grains and greater heterogeneity of the CPD distribution (FIGS. 1D and 1G). In the sample with solid-diffused F4TCNQ, some small F4TCNQ particles were placed on top of a $MAPbI_3$ film, and the CPD imaging was conducted around the edge (the green color line as indicated in FIG. 1H) to include both neat and doped perovskite regions. Such method leads to a clear edge between diffused and undiffused regions that can be visualized in the CPD image (FIG. 1H), thus the CPD heterogeneity is even higher. The change of absolute CPD caused by F4TCNQ doping is clearly demonstrated in FIG. 1I. A decrease of surface potential or in other words an increase of work function was observed for the $MAPbI_3$:F4TCNQ films, irrespective of direct mixing or solid diffusion. The increase of heterogeneity for the $MAPbI_3$:F4TCNQ films is also reflected in the broadening of the curves. This confirmed p-type doping of $MAPbI_3$ by F4TCNQ. Specifically, after the addition of electron-withdrawing F4TCNQ molecule to the $MAPbI_3$, owing to the deep lowest unoccupied molecular orbital (LUMO) level of F4TCNQ, electrons in the valance band of $MAPbI_3$ can be thermally activated into the LUMO level of F4TCNQ, which leaves holes in $MAPbI_3$ and thus causes its p-doping (FIG. 1J). As a result, the hole concentration in the $MAPbI_3$ film increased. The carrier concentration change upon F4TCNQ doping has been evaluated by analyzing the dark capacitance versus voltage (C-V) characteristics of the perovskite devices (FIG. 5). Charge density profiles were extracted from the C-V curves using Mott-Schottky analysis.[26, 27] The carrier concentration in the perovskite layer was calculated to be $0.6 \times 10^{16}$ $cm^{-3}$ in the neat $MAPbI_3$ film which increased to $2.4 \times 10^{16}$ $cm^{-3}$ after the addition of 0.03 wt % F4TCNQ. This molecular p-type doping strategy enabled the fabrication of an HTL-free PSC with a simplified device configuration but still effective p-n heterojunction (i.e. p-doped perovskite and n-type ETL), and thus enhanced device performance.

Electronic Properties of Doped Perovskite Films

Figure 2A:
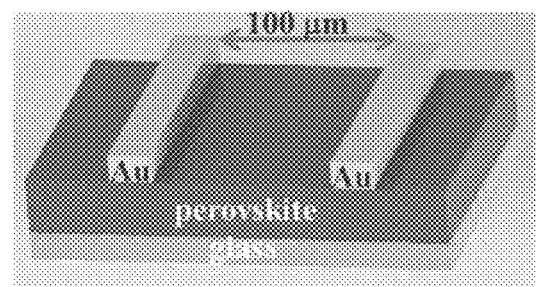
FIGS. 2A-2H. Conductivities and photoluminescence lifetimes of neat or doped perovskite films.
Figure 2B:
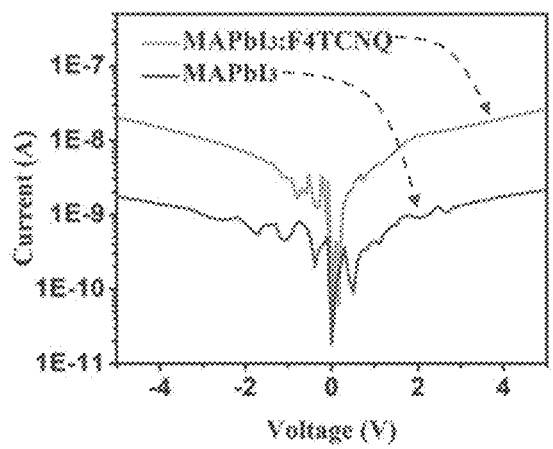
Figure 2C:
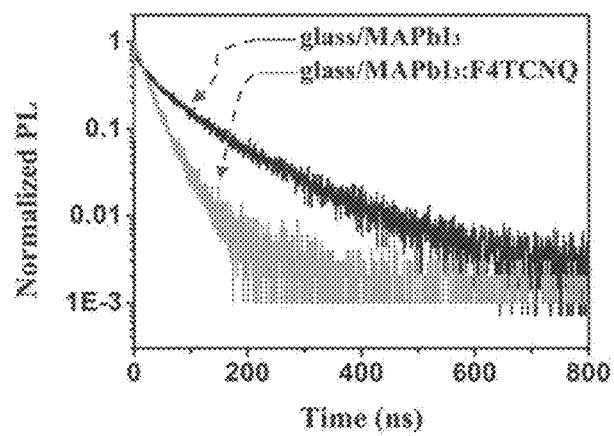

The electronic properties of the $MAPbI_3$:F4TCNQ films were investigated by comparing their current density-voltage (J-V) characteristics with pristine $MAPbI_3$ films deposited on glass substrates in the dark condition. The lateral conductivity was measured across gold electrodes spaced 100 μm apart (FIG. 2A). As shown in FIG. 2B, the $MAPbI_3$:F4TCNQ film exhibited a nearly ten-fold increase in conductivity over the neat $MAPbI_3$ film, which confirmed that F4TCNQ doped $MAPbI_3$. The charge transfer from $MAPbI_3$ to F4TCNQ can cause quenching of photoluminescence (PL) from the $MAPbI_3$ layer, which was measured by using time-resolved photoluminescence (TRPL) decay for $MAPbI_3$ films deposited on glass substrates (FIG. 2C). The $MAPbI_3$:F4TCNQ prepared on glass substrate showed a PL lifetime of 65 ns, which is four-fold shorter than the PL lifetime of pristine $MAPbI_3$ film (268 ns) on glass.

Figure 2D:
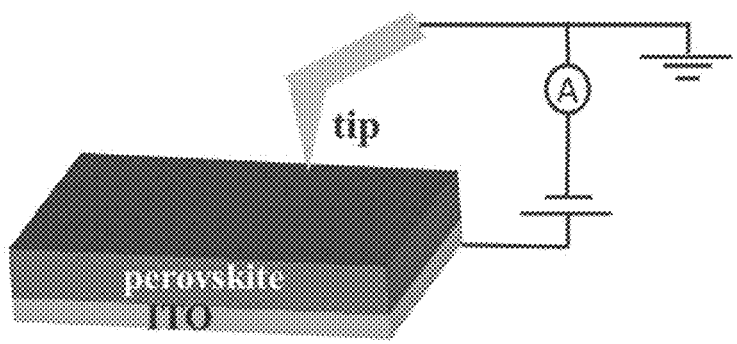
Figure 2E:
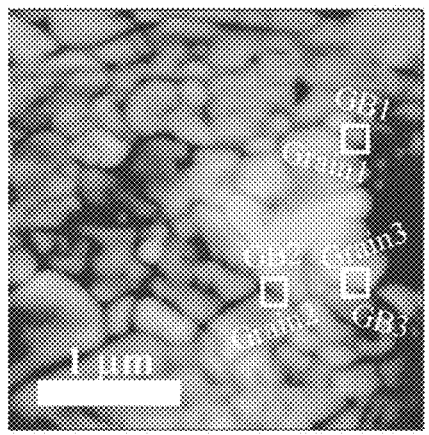
Figure 2F:
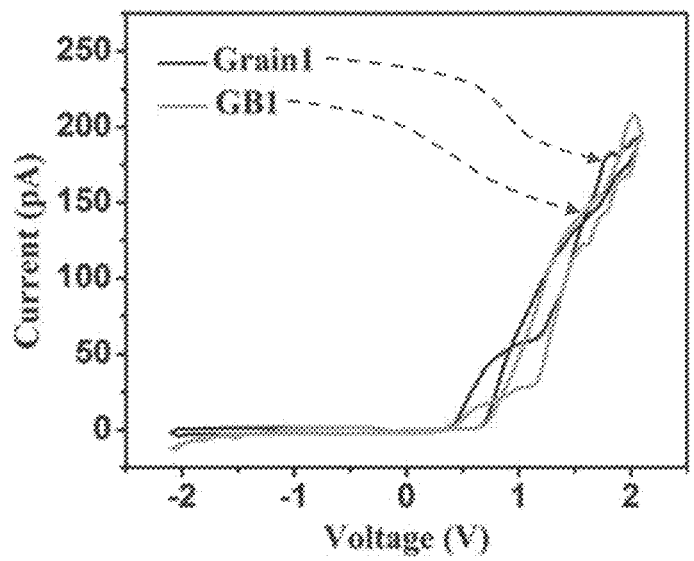
Figure 2G:
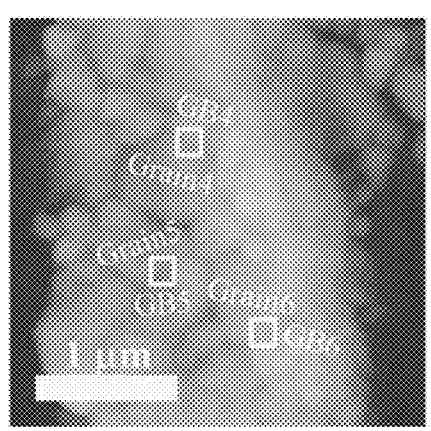
Figure 2H:
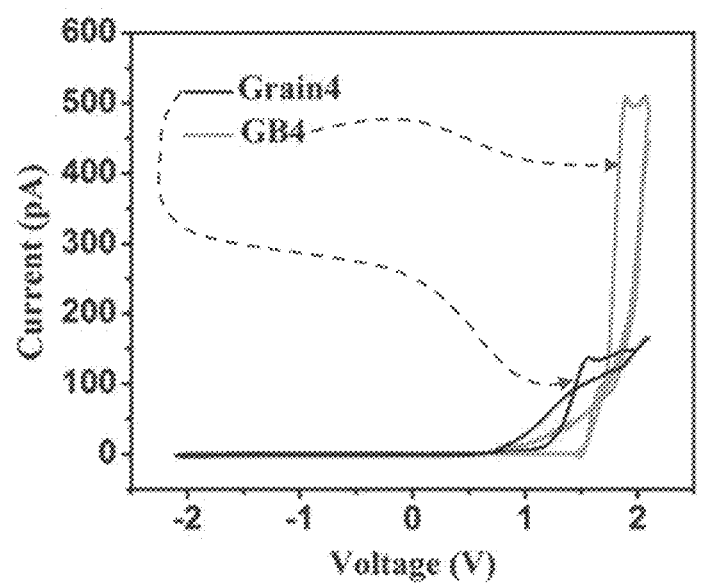
Figure 6A:
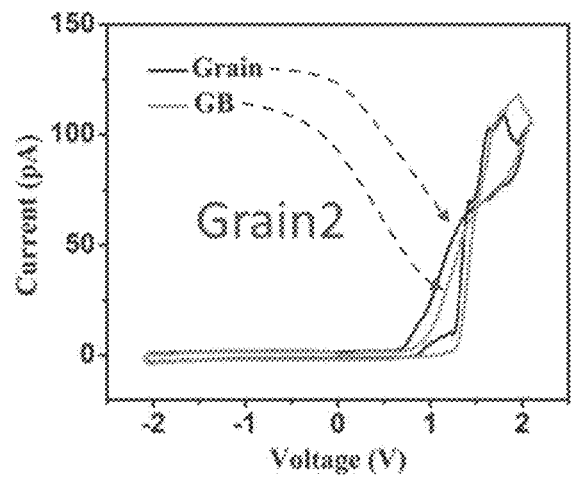
FIGS. 6A-6D. Conductivities of neat or doped perovskite films. Local dark current measured at the GBs and on the grains for the (FIGS. 6A-6B) MAPbI$_3$ film as indicated in FIG. 2E, and (FIGS. 6C-6D) MAPbI$_3$:F4TCNQ film as indicated in FIG. 2G.
Figure 6B:
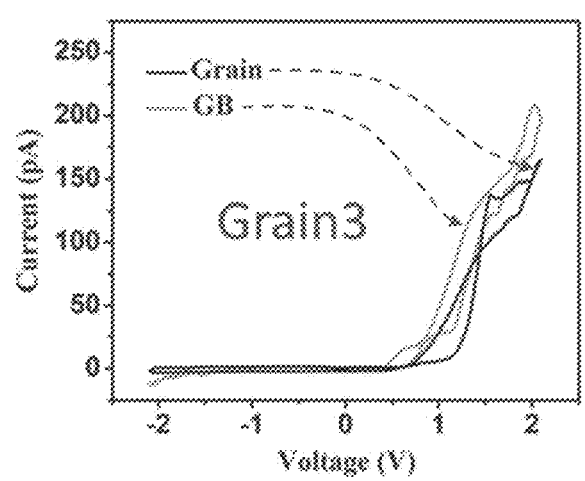
Figure 6C:
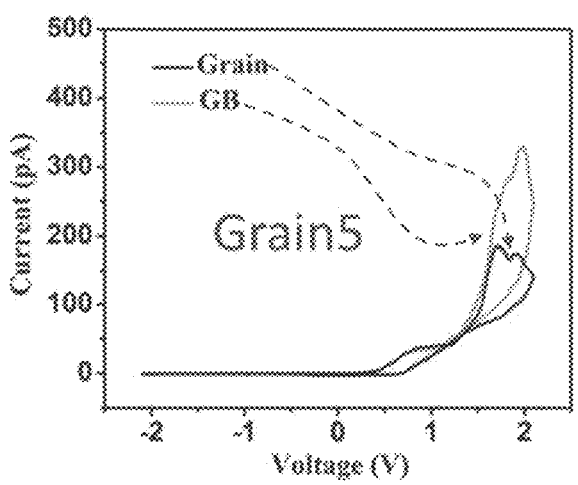
Figure 6D:
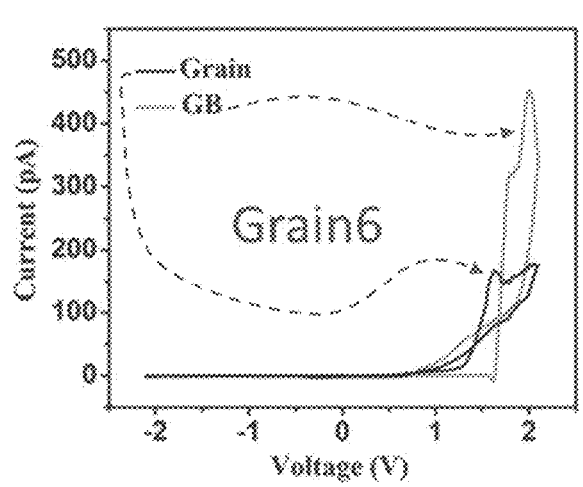

The relative large molecular size of F4TCNQ likely prevents integration into the lattice of $MAPbI_3$. Therefore, the F4TCNQ molecules may remain at the grain boundary (GB) regions of perovskite films and/or perovskite/electrode interfaces. To determine the lateral distribution of F4TCNQ molecules, the local dark conductivity at grains and GBs was measured using conducting atomic force microscopy (c-AFM). FIG. 2D illustrates the c-AFM setup, where the microscope tip was positioned at locations randomly chosen from topographic AFM images (FIGS. 2E and 2G). The tip bias was scanned in the range 2.0 V to −2.0 V at a rate of 0.14 V $s^{-1}$. For the neat $MAPbI_3$ film, the dark currents were similar at the grain and GB regions (FIG. 2F and FIGS. 6A-6B), which is in accordance with previous reporting.[28] In sharp contrast, the dark currents measured at the GB regions of the $MAPbI_3$:F4TCNQ film were notably higher (FIG. 2H and FIGS. 6C-6D), elucidating the remarkably improved conductivity at the GB region after molecular doping of $MAPbI_3$ by F4TCNQ. At the regions close to GBs, the F4TCNQ molecules and $MAPbI_3$ undergo charge transfer, leading to an increase in carrier density in $MAPbI_3$ and thus the enhanced dark conductivity.[29]

Morphologies and Crystallinities of Perovskite Films

Figure 3A:
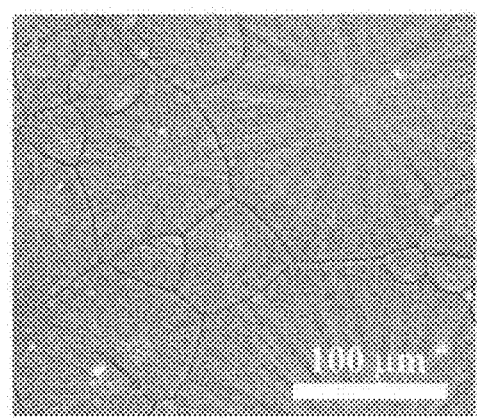
FIGS. 3A-3G. Perovskite film morphology, device structure and photovoltaic performance.
Figure 3B:
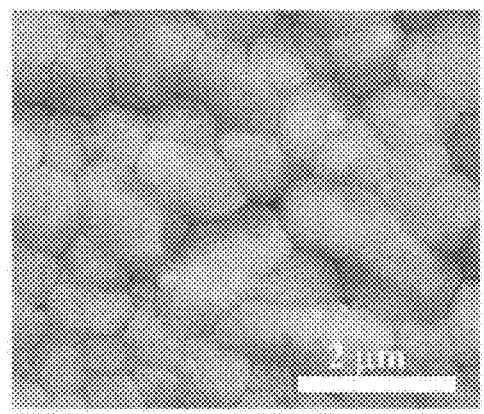
Figure 8:
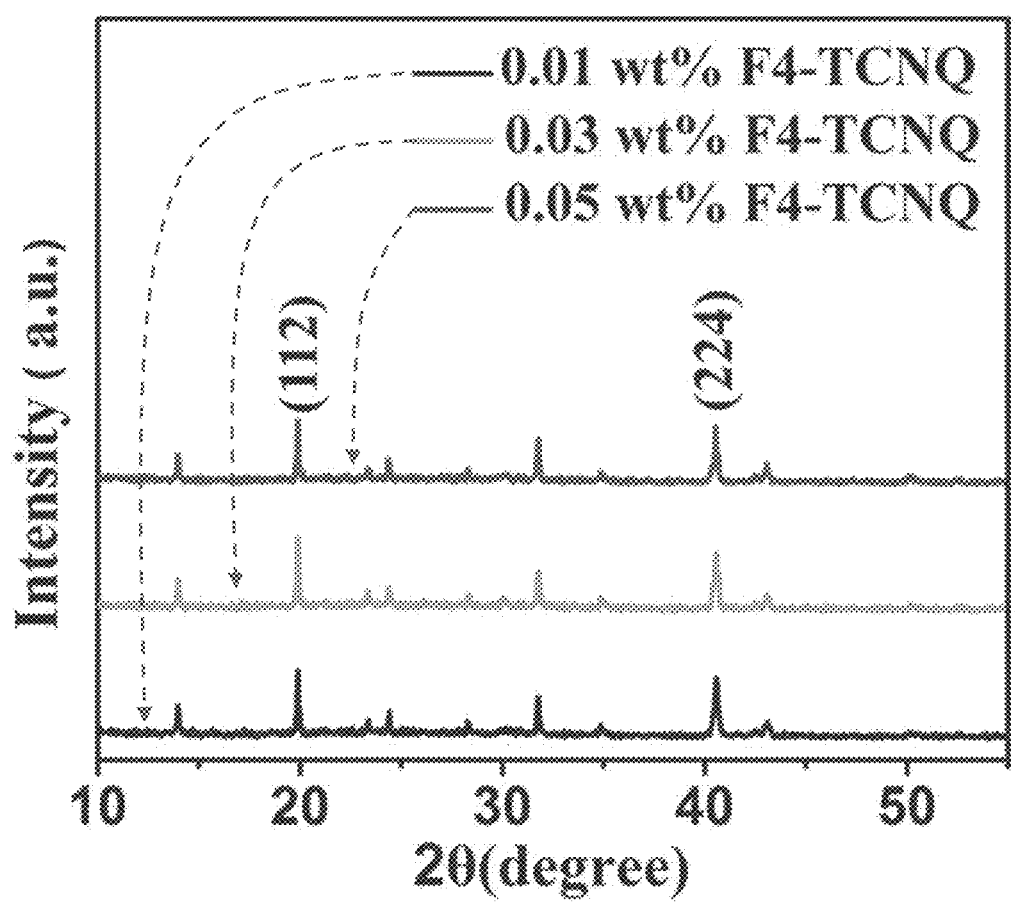
FIG. 8. XRD (X-ray diffraction) characterization based on F4TCNQ dopant concentration optimization. XRD patterns of the bladed MAPbI$_3$ films prepared with different amounts of F4TCNQ. According to certain embodiments, the introduction of F4TCNQ did not substantially affect the crystallinity of the perovskite films.
Figure 10:
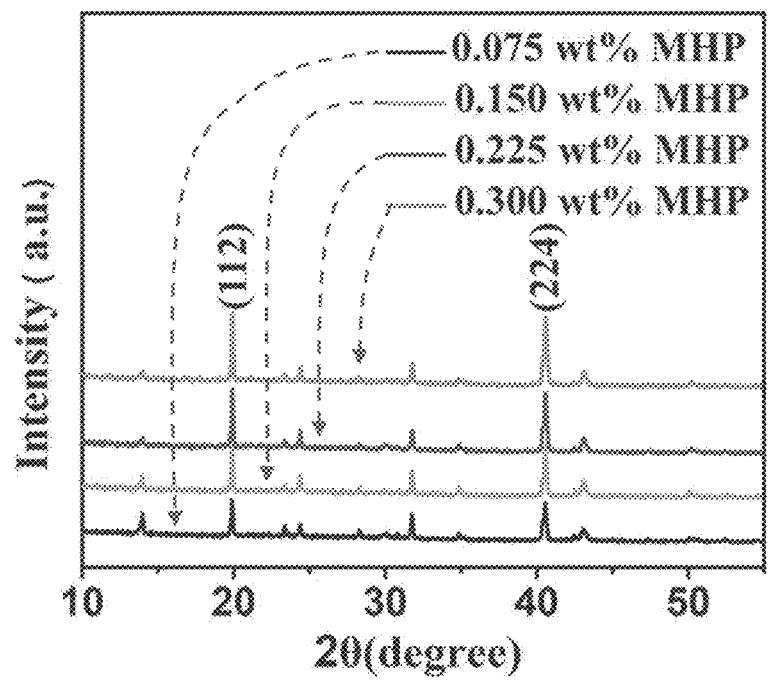
FIG. 10. XRD characterization based on MHP additive concentration optimization. XRD patterns of the bladed MAPbI$_3$ films prepared with 0.03 wt % F4TCNQ and different amounts of MHP.
Figure 11:
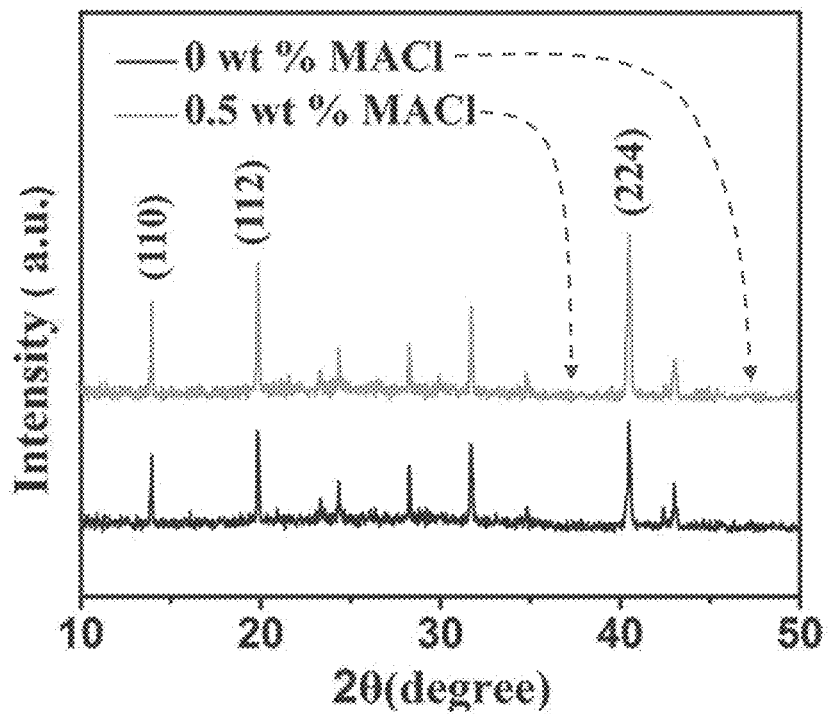
FIG. 11. XRD patterns of bladed perovskite films prepared using a co-solvent annealing technique in the absence or presence of MACl. The main MAPbI$_3$ XRD peaks, i.e. (110), (112) and (224), intensify after the introduction of 0.5 wt % excess MACl (FIG. 11), indicating that chlorine plays an important role in improving the crystallinity of perovskite films.

High-quality perovskite films with large grains, high crystallinity and complete surface coverage are also important to achieving high-performance HTL-free devices. The blending of F4TCNQ in the perovskite in a small percentage (ranged from 0.01 wt % to 0.05 wt %) did not notably change the morphology and grain size of the perovskite films, as shown by the SEM images in FIGS. 7A-7H, nor cause a drastic change of crystallinity, as shown by the XRD patterns of bladed $MAPbI_3$ films prepared with different amounts of F4TCNQ in FIG. 8. Accordingly, methylammonium hypophosphite (MHP) and methylammonium chloride (MACl) were introduced as additives to the precursor solution, and co-solvents (dimethyl sulfoxide (DMSO)/chlorobenzene (CBZ)) post-annealing process was also combined to achieve a high-quality and high-crystalline $MAPbI_3$ film (FIGS. 9A-9H, FIGS. 10 and 11 for SEM images and XRD patterns of bladed $MAPbI_3$ films prepared with different amounts of MHP as well as using co-solvent annealing technique in the absence or presence of MACl).[9, 10, 16, 30, 31] FIGS. 3A and 3B show representative SEM images of the bladed perovskite films after optimization, which featured a uniform morphology that extended hundreds of micrometers. The perovskite domains were densely packed together, and without observable voids at domain boundaries (FIG. 3A). It should be noted that these domains are not single crystalline grains. Each micrometer-scale convection domain was comprised of micro-sized grains ranging from 800-1700 nm (average above 1 μm, FIG. 3B).

Photovoltaic Performances of Perovskite-Based Devices

Figure 3C:
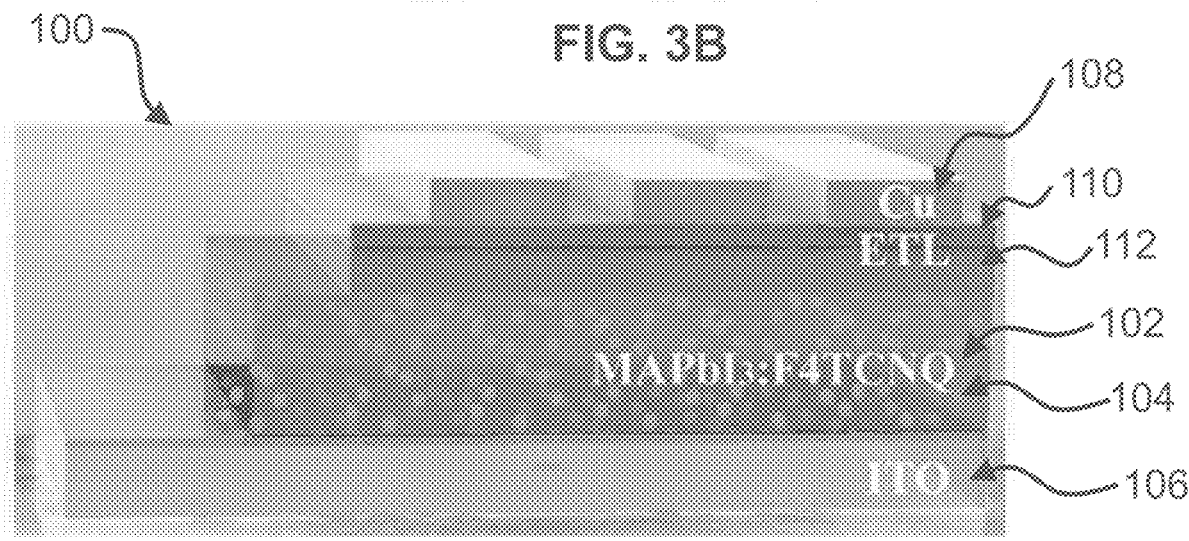
Figure 3D:
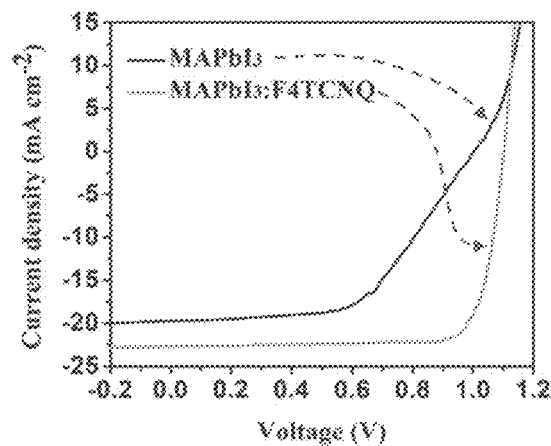
Figure 3E:
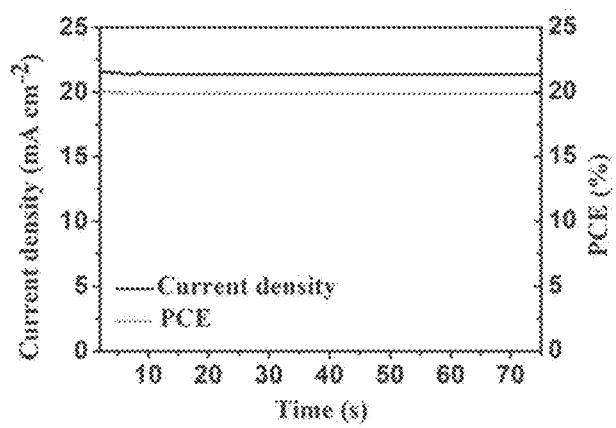
Figure 3F:
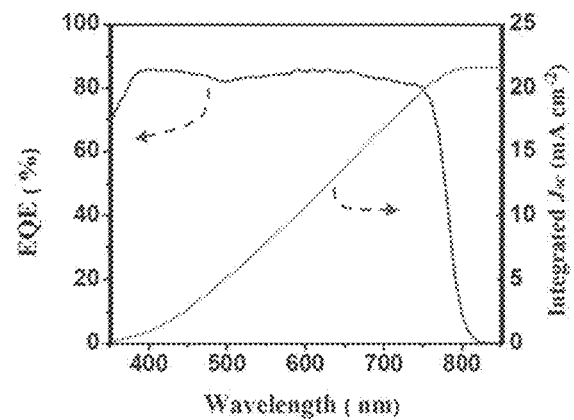
Figure 3G:
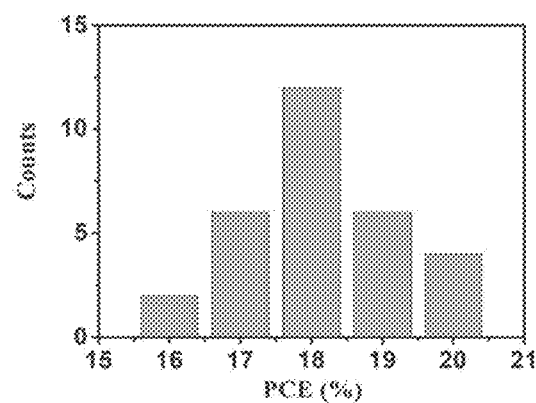
Figure 12:
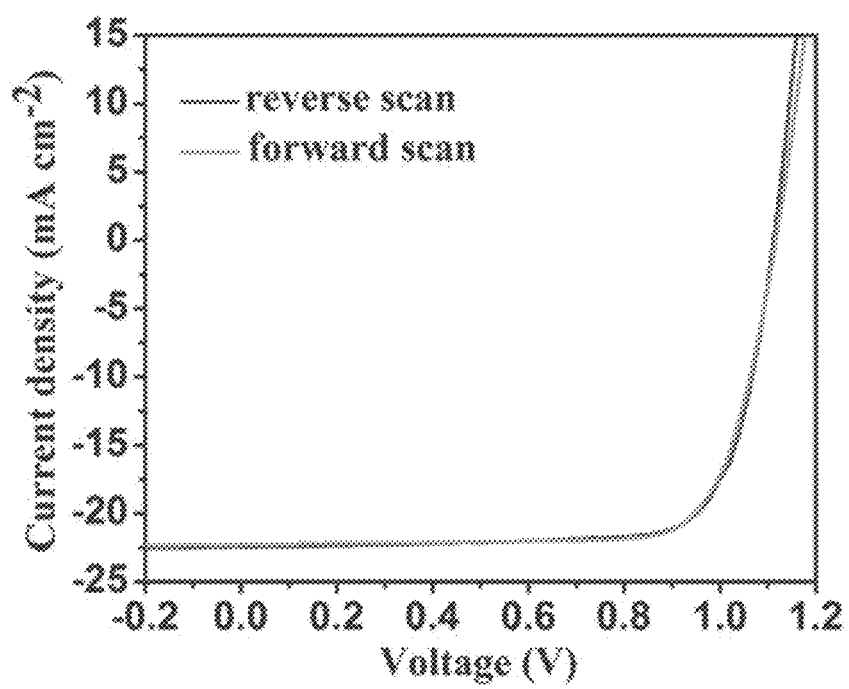
FIG. 12. J-V (current density vs. voltage) curves hysterisis. J-V characteristics of the PSC based on MAPbI$_3$: F4TCNQ film measured under different scanning directions.
Figure 13:
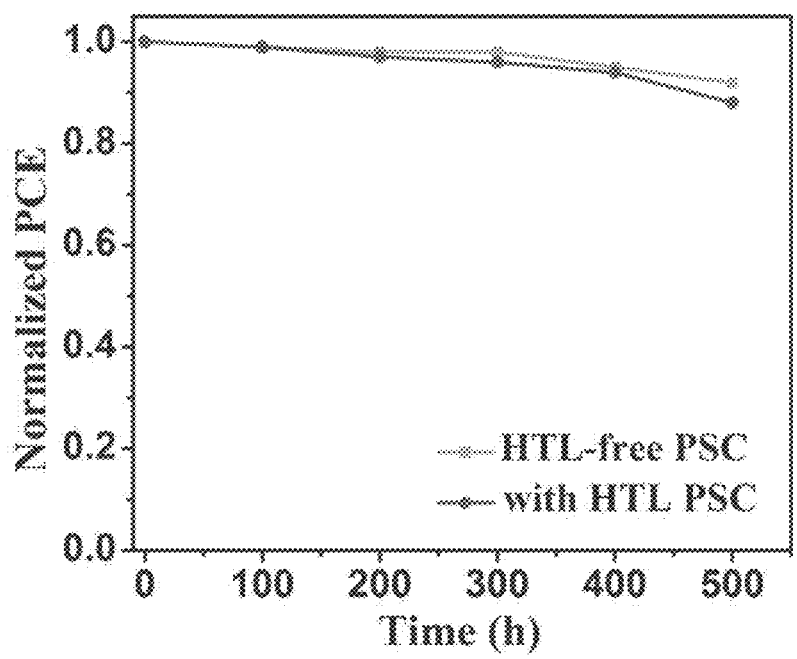
FIG. 13. Stability test. The stability test as a function of storage time in ambient conditions for PSCs in the absence or presence of HTL.

The impact of molecular doping by F4TCNQ on photovoltaic performance was investigated in detail. As illustrated in FIG. 3C, inverted HTL-free PSCs were fabricated with a device configuration of ITO/MAPbI$_3$:F4TCNQ/ETL/Cu. FIG. 3D shows the current density versus voltage (J-V) characteristics of PSCs based on the pristine MAPbI$_3$ films and MAPbI$_3$:F4TCNQ films, with photovoltaic parameters summarized in Table 1. The reference PSC without F4TCNQ (i.e. MAPbI$_3$) exhibited a poor PCE of just 11.0%, which is in accordance with that of most reported HTL-free PSCs.[23, 24] Surprisingly, with the addition of F4TCNQ, notable concurrent enhancements of the $J_{sc}$, $V_{oc}$ and FF have been achieved. The champion cell based on MAPbI$_3$:F4TCNQ film achieved the highest PCE of 20.2%, with $J_{sc}$ of 22.7 mA cm$^{-2}$, $V_{oc}$ of 1.10 V and FF of 0.81. To the best of our knowledge, this is the record efficiency for the bladed PSCs in the absence of HTLs. For comparison, the PSC based on the PTAA HTL and undoped MAPbI$_3$ layer has been fabricated, which showcases a PCE of 19.5%, along with a $J_{sc}$ of 22.1 mA cm$^{-2}$, a $V_{oc}$ of 1.12 V and a FF of 0.79. This result is in good agreement with our previous reports.[8, 9, 16] It is worth noting that the demonstrated HTL-free device showed similar or even better photovoltaic performance, highlighting the effectiveness of such a doping strategy for constructing high-performance PSCs with not only a simpler structure, but also less deposition steps and lower material cost. The J-V curves of MAPbI$_3$:F4TCNQ-based device were measured in both reverse and forward scan modes at a scan rate of 0.1 V s$^{-1}$, and almost no hysteresis was observed (FIG. 12). FIG. 3E shows the stabilized photocurrent density of this device as measured at 0.93 V, giving a stabilized PCE exceeding 20.0% under continuous light-soaking. This high stabilized PCE output is among the best record for HTL-free PSCs, and is quite remarkable given that the device is prepared using a scalable fabrication method. FIG. 3F shows the external quantum efficiency (EQE) of the champion device. The integrated $J_{sc}$ from the EQE measurement agreed well with the $J_{sc}$ values measured under AM 1.5G one sun illumination (FIG. 3D). The fabrication procedure was repeated to confirm the reliability and reproducibility of the results. The PCE histogram was collected from 30 independent cells (FIG. 3G), revealing that more than 73% of the cells had PCEs above 18.0%, and more than 93% had PCEs higher than 17.0% under one sun illumination. A study of the stability for the devices with or without HTL has been conducted. The devices were stored under ambient conditions (where humidity and temperature were about 20% and 25° C., respectively) without any encapsulation. As compared to the devices with HTL, the HTL-free device exhibits a slightly better stability, which maintained over 92% of its initial PCE after storage for 500 h (FIG. 13).

TABLE 1

Photovoltaic parameters of PSCs employing neat or doped perovskite layers under one sun light illumination (AM 1.5 G, 100 mW cm$^{-2}$).

| PSCs | $J_{sc}$/mA cm$^{-2}$ | $V_{oc}$/mV | η□/% | Averageη□/% | FF |
|---|---|---|---|---|---|
| MAPbI$_3$ | 19.7 | 1.00 | 11.0 | 9.52 ± 0.72 | 0.56 |
| MAPbI$_3$:F4TCNQ | 22.7 | 1.10 | 20.2 | 18.85 ± 0.35 | 0.81 |

[*] data for average PCE (η) were calculated from at least 30 devices.

Analysis of Interfacial Hole Extraction Dynamics

Figures 4A, 4B:
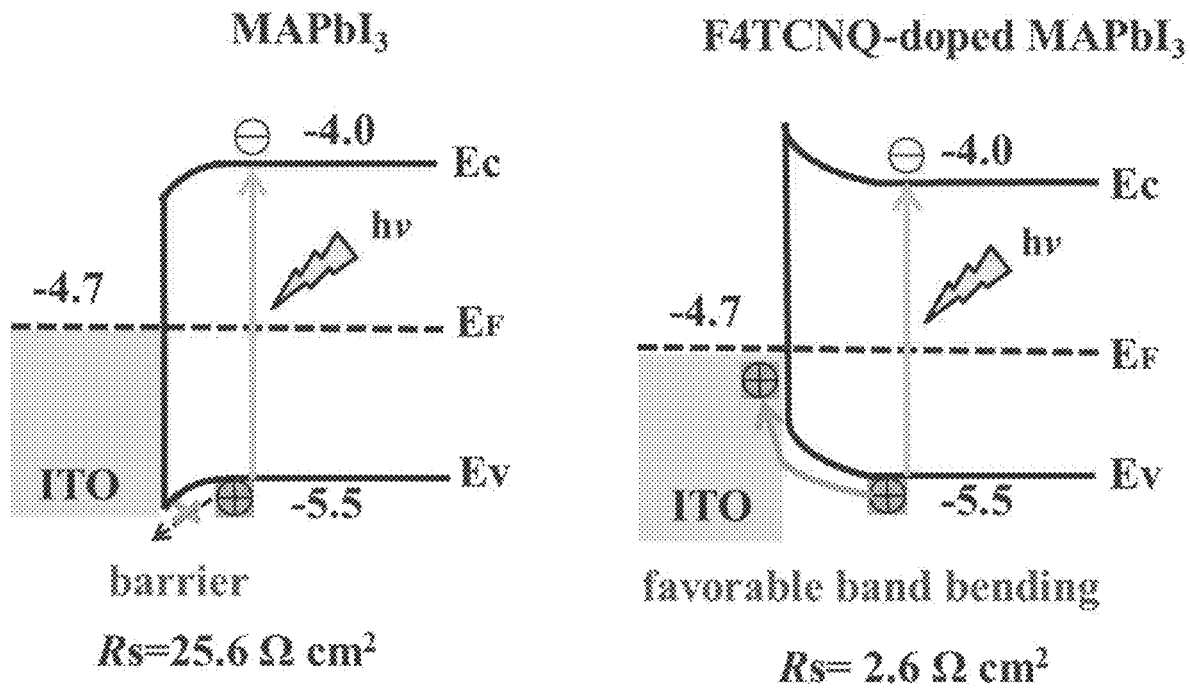
FIGS. 4A-4B. Interfacial hole transfer dynamics. Schematic illustrations of hole transfer at the (FIG. 4A) ITO/$MAPbI_3$ or (FIG. 4B) ITO/F4TCNQ-doped $MAPbI_3$ interface.

It is noted from FIG. 3D and Table 1 that the almost two-fold efficiency enhancement in the F4TCNQ-doped devices primarily originates from the remarkable FF increase. Further analysis of the J-V curves in FIG. 3D revealed that F4TCNQ doping of the perovskite layer significantly reduced device series resistance (Rs) from 25.6 Ωcm$^2$ for undoped device to 2.6 Ωcm$^2$ for doped device. The influence of Rs on device FF has been well established in diode based solar cells,[32] according to the classical equation based on diode equation:

$$I = I_L - I_0 \exp\left[\left[\frac{q(V + IR_S)}{nkT}\right]\right] I = I_L - I_0 \exp\left[\frac{q(V + IR_S)}{nkT}\right] \quad (1)$$

where I is the device output current, $I_L$ is the maximum light generated current, $I_0$ is saturated dark current, Rs is series resistance, n is ideal factor, k is Boltzmann constant, T is temperature. Assuming a diode ideal factor of 1, the FFs for the undoped and doped devices were calculated to be 53% and 83% from Equation (1), which are very close to measured values of 56% and 81%, respectively. This indicates the increased device FF for the devices with doped MAPbI$_3$ is mainly caused by the reduction of the series resistance. To find out the origin of reduced series resistance by F4TCNQ doping, energy level diagrams are constructed and shown in FIGS. 4A-4B for the perovskite/ITO interface with or without F4TCNQ doping. Here the energy levels were extracted from the literature for the films made with same composition and similar method.[33,34] For undoped MAPbI$_3$, the Fermi level of pristine MAPbI$_3$ (nearly intrinsic) is slightly lower than that of ITO (−4.7 eV).[34] The Fermi level lines up during contact formation and causes a downward band-bending in MAPbI$_3$, which forms a barrier for hole extraction from MAPbI$_3$ to ITO (FIG. 4A). This would also increase the possibility of charge recombination and increase series resistance at the ITO/perovskite interface. In contrast, the incorporation of F4TCNQ in the MAPbI$_3$ films turns the MAPbI$_3$ to more p-type, particularly at the interface of ITO and MAPbI$_3$, which should avert band-bending direction (FIG. 4B). This was confirmed by surface potential measurement that the F4TCNQ doping can increase work function of perovskite by approximately 0.1 to 0.2 eV (FIG. 1I). As is shown in FIG. 4B, the F4TCNQ doping results in an upward band bending at the ITO/MAPbI$_3$:F4TCNQ interface. In this case, the hole transfer from F4TCNQ-doped MAPbI$_3$ to ITO is thus facilitated, resulting in a reduced series resistance to increase FF.[35]

Figure 14:
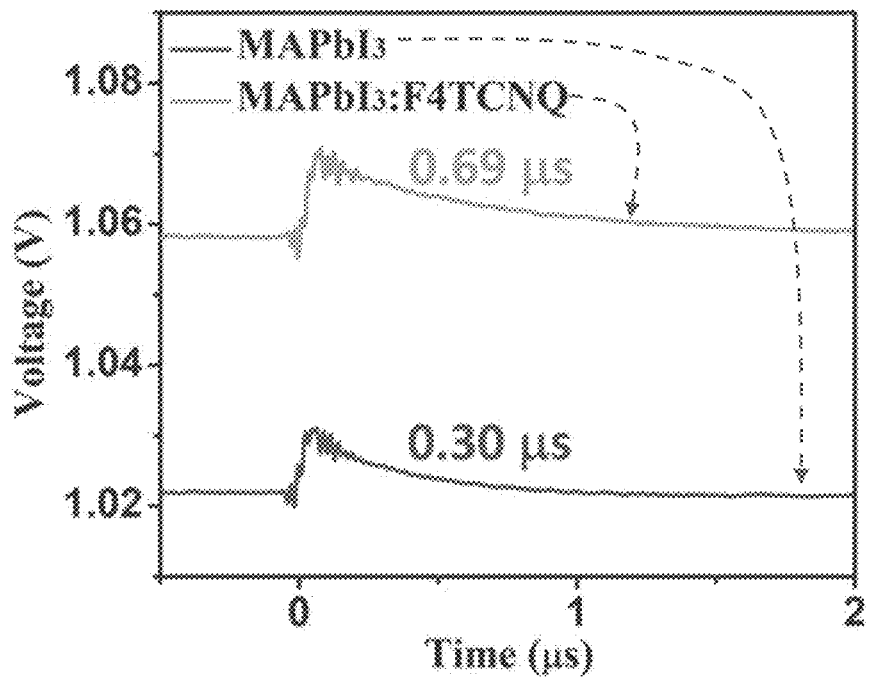
FIG. 14. Carrier recombination characterization. TPV of HTL-free PSCs based on MAPbI$_3$ or MAPbI$_3$:F4TCNQ films.

The diode Equation (1) predicts that Rs variation has no influence on device $V_{oc}$, while in our case, the F4TCNQ doping increased device $V_{oc}$ from 1.00 V to 1.10 V. This discrepancy indicates there is other factor, in addition to Rs, leads to the $V_{oc}$ enhancement. To find out the reason, a transient photovoltage spectroscopy (TPV) measurement was also carried out to understand the charge carrier recombination dynamics. As shown in FIG. 14, the MAPbI$_3$:F4TCNQ based PSC had a longer carrier lifetime (0.69 μs) than the reference device based on neat MAPbI$_3$ (0.30 μs) under one sun illumination. This result was consistent with the larger V$_{oc}$ for the device with doping. The observed carrier recombination lifetime enhancement could be a result of band bending configuration change due to doping, though there may be other reasons that may also change the carrier recombination lifetime. For instance, for the device with undoped MAPbI$_3$, the retarded hole extraction would increase the possibility of charge recombination, because they cannot be effectively extracted out.

It has been demonstrated how molecular doping influences the series resistance and interfacial charge transfer within HTL-free PSC devices with or without F4TCNQ incorporated in the perovskite layer. In the absence of HTL, both the eletrons and holes can be transported to the ITO/perovskite interface and recombine there, leading to serious interfacial charge recombination and thus inferior charge collection.[36] In addition, the mismatched work functions between perovskite and ITO would induce an undesirable energy barrier that leads to inferior hole transfer. These situations are all very detrimental to device performance. Molecular doping of perovskite by F4TCNQ to some extent induces favorable interfacial band bending, which allows efficient transport of holes at ITO/perovskite interface (FIG. 4B).[35]

Figure 15:
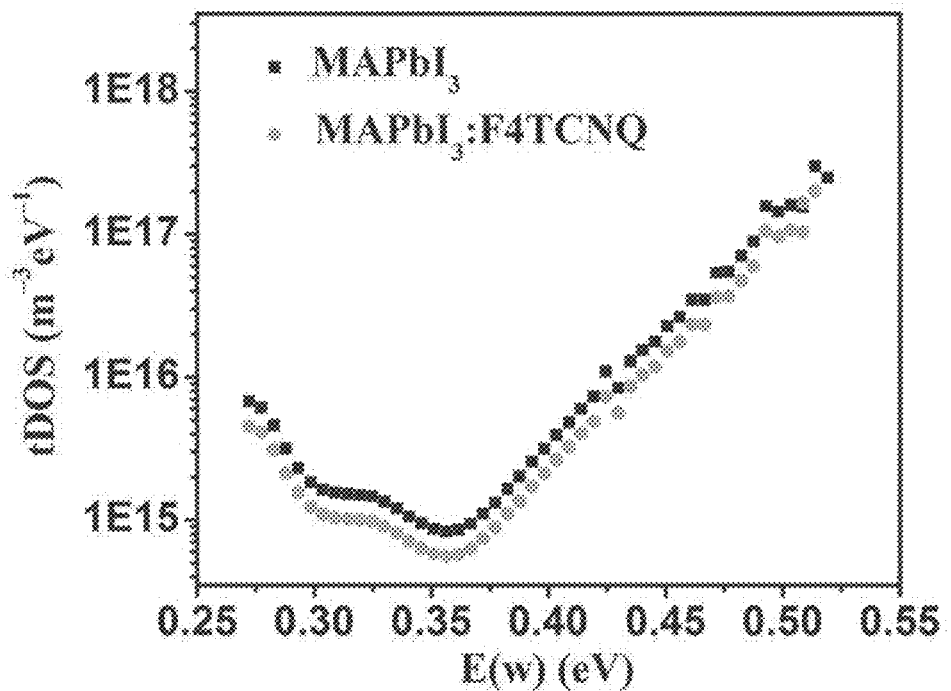
FIG. 15. Charge trap density characterization. Trap density of states obtained from TAS measurement for devices based on MAPbI$_3$ and MAPbI$_3$:F4TCNQ.
Figure 16A:
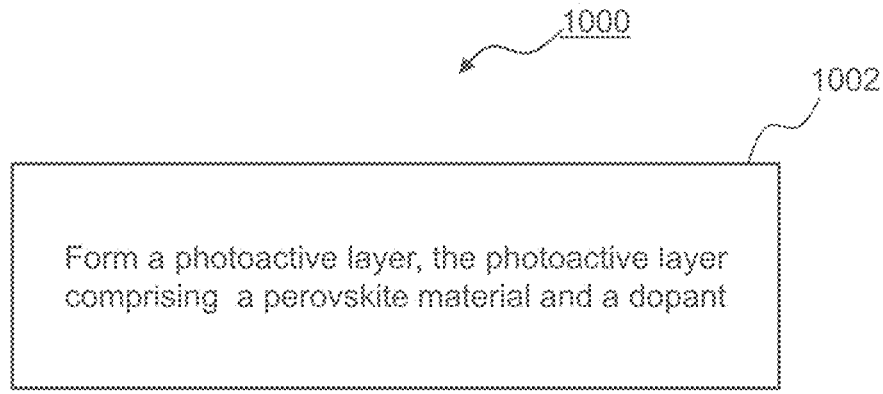
FIGS. 16A-16F. Flowcharts showing steps of a method for making a photoactive device, according to certain embodiments.
Figure 16B:
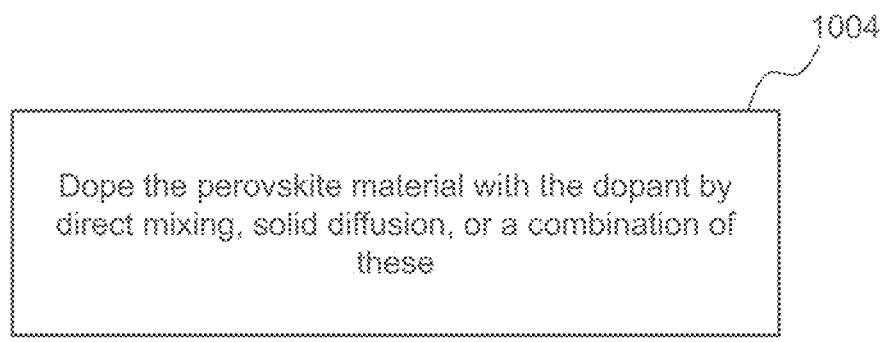
Figure 16C:
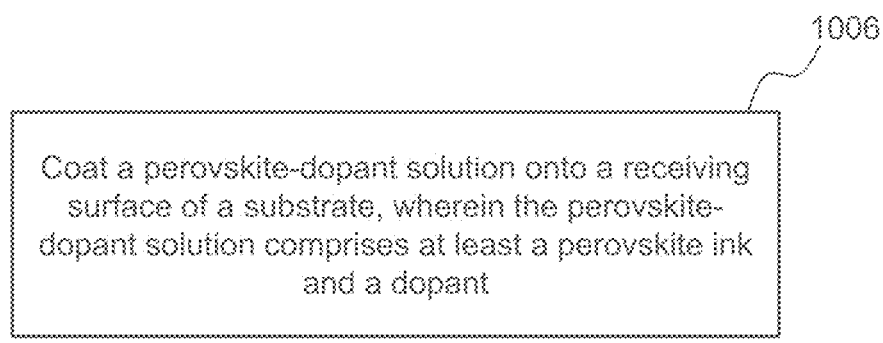
Figure 16D:
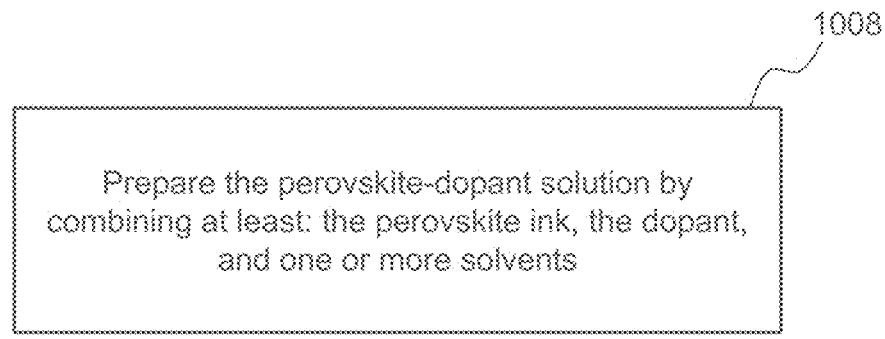
Figure 16E:
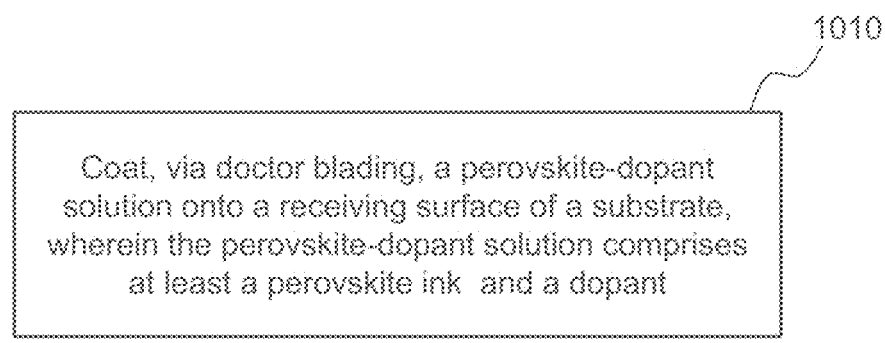
Figure 16F:
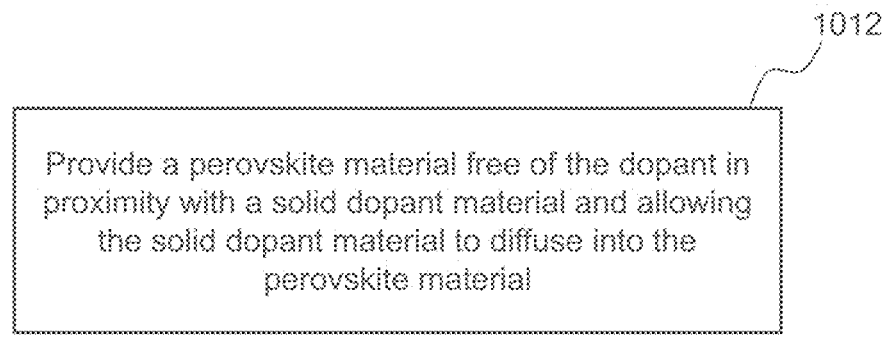

Choosing an appropriate p-type dopant with proper molecular size and selected surface hydrophilicy with ITO substrate is promising to further improve the ITO/perovskite interfacial affinity. Owing to the larger molecular size of F4TCNQ than the interstitial sites in perovskite structure, the F4TCNQ concentrated at the grain boundary regions. The dopant assisted with charge dissociation and thus resulting in more balanced transfer of electrons and holes to their respective electrodes, which decreased the possibility of the charge carrier recombination. The charge trap density within MAPbI$_3$:F4TCNQ based PSC was even slightly smaller than its pristine MAPbI$_3$ counterpart (FIG. 15). It has been demonstrated that the trap sites within the organic semiconductors can be reduced due to partial filling by doping, typically at very low doping levels.[37]

An additive-assisted strategy for p-type molecular doping of solution-bladed perovskite films was demonstrated. F4TCNQ-doped MAPbI$_3$ films show increased electrical conductivity, especially at grain boundary regions, and increased charge carrier concentrations. The incorporation of F4TCNQ in perovskite layers could modify the ITO/perovskite interface with reduced series resistance, which could be attributed to the favorable interfacial band bending for facilitated hole transfer and extraction from perovskite to ITO. The simple but effective approach adopted enabled the scalable fabrication of HTL-free PSC devices with a simplified device geometry. Molecular doping of perovskite film by F4TCNQ led to the considerable enhancement of photovoltaic performance from 11.0% to 20.2%. The MAPbI$_3$:F4TCNQ-based device exhibited a stabilized PCE that exceeded 20.0% and negligible hysteresis. This effective doping strategy eliminates the HTL preparation step, thus simplifying the PSC fabrication process and reducing costs. Extending the application of this doping technique to a broader range of semiconducting materials will definitely benefit the construction of other high performance, printed optoelectronic devices.

Example Techniques:

Materials preparation. Lead iodide (PbI$_2$, 99.9985%) was purchased from Alfa Aesar. Methylammonium iodide (MAI) was purchased from Dyesol. Methylammonium chloride (MACl, 98%), 2,3,5,6-tetrafluoro-7,7,8,8-tetracyanoquinodimethane (F4TCNQ, 97%), N,N-dimethylformamide (DMF, anhydrous, 99.8%), dimethyl sulfoxide (DMSO, 99.9%), acetonitrile (anhydrous, 99.8%) and chlorobenzene (CBZ, anhydrous, 99.8%) were purchased from Sigma-Aldrich. All chemicals were used as received without further purification.

Device fabrication. The ITO glass substrates were ultrasonically washed with deionized water, acetone, and isopropanol for 30 min successively. After drying, the cleaned ITO glass was treated by UV-ozone (UVO) for 15 min then used immediately for device fabrication. To form a perovskite precursor (1 M), an equimolar ratio of PbI$_2$ and MAI was dissolved in DMF with different amounts of methylammonium hypophosphite (MHP, 0.075 to 0.300 wt %), F4TCNQ (0.01 to 0.05 wt %) and 0.5 wt % MACl (for chlorine-containing precursor) added as required. Specifically, to implement solution-processed molecular doping of the perovskite photoactive layer, F4-TCNQ was dissolved in DMF separately, and then added to the solution of as-prepared MAPbI$_3$ precursor solution. Typically, MHP/DMF additive was used to increase grain size, improve perovskite film crystallinity and surface coverage. The bladed coating of perovskite films was conducted in an N$_2$-purged glovebox (below 1.0 ppm O$_2$ and H$_2$O). The perovskite precursor solution (approximately 5 to 10 μL) was dripped onto the ITO glass on a hot plate set at 150° C., then swiped linearly by a glass blade at a speed of 0.75 cm s$^{-1}$. The as-prepared perovskite films were then annealed at 100° C. for 30 min. For solvent annealing, the perovskite films were annealed under a vapor of mixed DMSO/CBZ solvent (1:1 v/v) at 100° C. for 30 min according to a literature method.[29] Finally, C$_{60}$ (20 nm, Nano-C), bathocuproine (BCP, 8 nm, Sigma-Aldrich), and Cu electrode (80 nm) were sequentially deposited on the perovskite layer by thermal evaporation to form a complete PSC device.

Device characterization. Scanning electron microscopy (SEM) images were obtained with a Quanta 200 FEG environmental scanning electron microscope. X-ray diffraction (XRD) patterns were acquired by a Bruker D8 Discover Diffractometer with Cu Kα radiation (1.5406 Å). Photoluminescence (PL) spectrum was measured with a Horiba iHR320 Imaging Spectrometer at room temperature. A 532 nm green laser (Laserglow Technologies) with an intensity of 100 mW cm$^{-2}$ was used as the excitation source. Time-resolved photoluminescence (TRPL) was obtained using the DeltaPro with a pulsed laser source at 406 nm (Horiba NanoLED 402-LH; pulse width below 200 ps, 20 pJ per pulse, approximately 1 mm$^2$ spot size), and the signal was recorded using time corrected TCSPC. Conductive atomic force microscopy (c-AFM) measurements were performed on an Asylum Research MFP-3D AFM using Pt-coated Si conductive probes (PPP-EFM, Nanosensors). The conductivity of perovskite films was measured by a two-electrode method on glass substrates. The J-V characteristics of the cells (voltage scanning rate 0.1 V s$^{-1}$) and the steady photocurrent under maximum power output bias (0.93 V) were recorded with a Keithley 2400 source-meter under simulated AM 1.5G irradiation by a Xenon lamp (Oriel 67005), which was calibrated by a silicon diode equipped with a Schott visible color KG5 glass filter. External quantum efficiency (EQE) was measured with a Newport QE measurement kit. The J-V and EQE measurements were conducted under ambient air conditions without encapsulation. A non-reflective shadow mask was used to define a 0.08 cm² active area of the PSCs. The series resistance (Rs) is derived from the slope of the J-V curve at the open-circuit voltage point. Transient photovoltage (TPV) decay was measured under 1 sun illumination and recorded by a 1 GHz Agilent digital oscilloscope.

TABLE 2

Photovoltaic parameters obtained from HTL-free PSCs employing bladed MAPbI₃ films incorporated with different amounts of F4TCNQ.

| F4TCNQ concentration (wt %) | $J_{sc}$/mA cm$^{-2}$ | $V_{oc}$/mV | $\eta$□/% | Average $\eta$□/% | FF |
|---|---|---|---|---|---|
| 0.01 | 21.9 | 1.08 | 16.7 | 14.55 ± 0.50 | 0.71 |
| 0.02 | 22.2 | 1.10 | 18.4 | 16.78 ± 0.42 | 0.75 |
| 0.03 | 22.7 | 1.10 | 20.2 | 18.85 ± 0.35 | 0.81 |
| 0.05 | 22.4 | 1.08 | 19.1 | 17.69 ± 0.38 | 0.79 |

REFERENCES

1. Kojima, A., Teshima, K., Shirai, Y. & Miyasaka, T. Organometal halide perovskites as visible-light sensitizers for photovoltaic cells. *J. Am. Chem. Soc.* 131, 6050-6051 (2009).
2. Correa-Baena, J.-P. et al. The rapid evolution of highly efficient perovskite solar cells. *Energy Environ. Sci.* 10, 710-727 (2017).
3. Li, X. et al. A vacuum flash-assisted solution process for high-efficiency large-area perovskite solar cells. *Science* 353, 58-62 (2016).
4. Yang, W. S. et al. Iodide management in formamidinium-lead-halide-based perovskite layers for efficient solar cells. *Science* 356, 1376-1379 (2017).
5. Zheng, X. et al. Defect passivation in hybrid perovskite solar cells using quaternary ammonium halide anions and cations. *Nat. Energy* 2, 17102 (2017).
6. Bi, D. et al. Efficient luminescent solar cells based on tailored mixed-cation perovskites. *Sci. Adv.* 2, e1501170 (2016).
7. Kim, J. H., Williams, S. T., Cho, N., Chueh, C.-C. & Jen, A. K. Y. Enhanced environmental stability of planar heterojunction perovskite solar cells based on blade-coating. *Adv. Energy Mater.* 5, 1401229 (2015).
8. Deng, Y., Dong, Q., Bi, C., Yuan, Y. & Huang, J. Air-stable, efficient mixed-cation perovskite solar cells with Cu electrode by scalable fabrication of active layer. *Adv. Energy Mater.* 6, 1600372 (2016).
9. Deng, Y. et al. Scalable fabrication of efficient organolead trihalide perovskite solar cells with doctor-bladed active layers. *Energy Environ. Sci.* 8, 1544-1550 (2015).
10. Yang, M. et al. Perovskite ink with wide processing window for scalable high-efficiency solar cells. *Nat. Energy* 2, 17038 (2017).
11. Barrows, A. T. et al. Efficient planar heterojunction mixed-halide perovskite solar cells deposited via spray-deposition. *Energy Environ. Sci.* 7, 2944-2950 (2014).
12. Hwang, K. et al. Toward Large Scale roll-to-roll production of fully printed perovskite solar cells. *Adv. Mater.* 27, 1241-1247 (2015).
13. He, M. et al. Meniscus-assisted solution printing of large-grained perovskite films for high-efficiency solar cells. *Nat. Commun.* 8, 16045 (2017).
14. Chen, H., Wei, Z., Zheng, X. & Yang, S. A scalable electrodeposition route to the low-cost, versatile and controllable fabrication of perovskite solar cells. *Nano Energy* 15, 216-226 (2015).
15. Deng, Y., Wang, Q., Yuan, Y. & Huang, J. Vividly colorful hybrid perovskite solar cells by doctor-blade coating with perovskite photonic nanostructures. *Mater. Horiz.* 2, 578-583 (2015).
16. Tang, S. et al. Composition engineering in doctor-blading of perovskite solar cells. *Adv. Energy Mater.* 7, 1700302 (2017).
17. Bi, C. et al. Non-wetting surface-driven high-aspect-ratio crystalline grain growth for efficient hybrid perovskite solar cells. *Nat. Commun.* 6, 7747 (2015).
18. Ye, S. et al. CuSCN-based inverted planar perovskite solar cell with an average PCE of 15.6%. *Nano Lett.* 15, 3723-3728 (2015).
19. Ameen, S. et al. Perovskite solar cells: influence of hole transporting materials on power conversion efficiency. *ChemSusChem* 9, 10-27 (2016).
20. Wu, W.-Q. et al. Integrated planar and bulk dual heterojunctions capable of efficient electron and hole extraction for perovskite solar cells with >17% efficiency. *Nano Energy* 32, 187-194 (2017).
21. Etgar, L. et al. Mesoscopic CH₃NH₃PbI₃/TiO₂ heterojunction solar cells. *J. Am. Chem. Soc.* 134, 17396-17399 (2012).
22. Li, Y. et al. Hole-conductor-free planar perovskite solar cells with 16.0% efficiency. *J. Mater. Chem.* A 3, 18389-18394 (2015).
23. Tsai, K.-W., Chueh, C.-C., Williams, S. T., Wen, T.-C. & Jen, A. K. Y. High-performance hole-transporting layer-free conventional perovskite/fullerene heterojunction thin-film solar cells. *J. Mater. Chem.* A 3, 9128-9132 (2015).
24. Ye, S. et al. A Strategy to simplify the preparation process of perovskite solar cells by co-deposition of a hole-conductor and a perovskite layer. *Adv. Mater.* 28, 9648-9654 (2016).
25. Ye, S. et al. A breakthrough efficiency of 19.9% obtained in inverted perovskite solar cells by using an efficient trap statepassivator Cu(thiourea)I. *J. Am. Chem. Soc.* 139, 7504-7512 (2017).
26. Zhang, Y. et al. Molecular doping enhances photoconductivity in polymer bulk heterojunction solar cells. *Adv. Mater.* 25, 7038-7044 (2013).
27. Kirchartz, T. et al. Sensitivity of the mott-schottky analysis in organic solar cells. *J. Phys. Chem.* C 116, 7672-7680 (2012).
28. Shao, Y. et al. Grain boundary dominated ion migration in polycrystalline organic-inorganic halide perovskite films. *Energy Environ. Sci.* 9, 1752-1759 (2016).
29. Duong, D. T. et al. Direct observation of doping sites in temperature-controlled, p-doped P3HT thin films by conducting atomic force microscopy. *Adv. Mater.* 26, 6069-6073 (2014).
30. Xiao, Z. et al. Unraveling the hidden function of a stabilizer in a precursor in improving hybrid perovskite film morphology for high efficiency solar cells. *Energy Environ. Sci.* 9, 867-872 (2016).
31. Wu, W.-Q., Chen, D., Huang, F., Cheng, Y.-B. & Caruso, R. A. Optimizing semiconductor thin films with smooth surfaces and well-interconnected networks for high-performance perovskite solar cells. *J. Mater. Chem.* A 4, 12463-12470 (2016).

32. Wang, Q., Bi, C. & Huang, J. Doped hole transport layer for efficiency enhancement in planar heterojunction organolead trihalide perovskite solar cells. *Nano Energy* 15, 275-280 (2015).
33. Schulz, P. et al. Electronic level alignment in inverted organometal perovskite solar cells. *Adv. Mater. Interf.* 2, 1400532 (2015).
34. Wang, Q. et al. Qualifying composition dependent p and n self-doping in $CH_3NH_3PbI_3$. *Appl. Phys. Lett.* 105, 163508 (2014).
35. Lange, I. et al. Band Bending in Conjugated Polymer Layers. *Phys. Rev. Lett.* 106, 216402 (2011).
36. Cui, P. et al. Highly efficient electron-selective layer free perovskite solar cells by constructing effective p-n heterojunction. *Solar RRL* 1, 1600027 (2017).
37. Jacobs, I. E. & Moulé, A. J. Controlling Molecular Doping in Organic Semiconductors. *Adv. Mater.* 29, 1703063 (2017).

ADDITIONAL EXAMPLES

Example 1: Exemplary Photoactive Device Configuration

FIG. 3C shows an exemplary configuration of a photoactive device, such as a photovoltaic cell, according to certain embodiments. Photoactive device 100, which is a photovoltaic cell, includes a photoactive layer 101. Photoactive layer 101 includes a perovskite material 102 (e.g., $MAPbI_3$) and a dopant 104 (e.g., F4TCNQ). Photoactive device 100 further includes a positive electrode 106, which is for example a transparent conductive oxide such as ITO (indium tin oxide). Photoactive device 100 is free of a hole transport layer between photoactive layer 101 and positive electrode 106. For example, photoactive layer 101 is at least partially in direct physical contact and in direct electronic communication with positive electrode 106. Photoactive device 100 further includes a negative electrode 108, which is for example a metal, such as copper or gold. Photoactive device 100 may also include at least one electron transport layer (ETL) 110, or one electron transport layer comprising multiple materials and/or multiple layers, between photoactive layer 101 and negative electrode 108. For example, electron transport layer 110 of photoactive device 100 includes two electron transport (sub) layers 110(I) and 110(II), which are, for example, a layer of $C_{60}$ and a layer of bathocuproine. Photoactive layer 101 may also include at least one additive, such as additive(s) to increase grain size, improve layer crystallinity, and improve layer surface coverage (e.g., over the positive electrode).

Example 2

FIGS. 16A-16F show an exemplary method 1000 for forming a photoactive device, according to certain embodiments. Method 1000 includes step 1002, in which a photoactive layer is formed, the photoactive layer comprising a perovskite material and a dopant. Method 1000 may also include any one or any combination of steps 1004-1012. Step 1004 includes doping the perovskite material with the dopant by direct mixing, solid diffusion, or a combination of these. Step 1006 includes coating a perovskite-dopant solution onto a receiving surface of a substrate, wherein the perovskite-dopant solution comprises at least a perovskite ink and a dopant. Step 1006 may be performed using a continuous-type coating method, such as doctor blading, as exemplified by step 1010. Step 1006 may be a form of the doping by direct mixing according to step 1004, in an embodiment. Step 1008 includes preparing the perovskite-dopant solution by combining at least: the perovskite ink, the dopant, and one or more solvents. Step 1008 may be a part of and/or a precursor to step 1004 and/or step 1006. Step 1012 includes providing a perovskite material free of the dopant in proximity with a solid dopant material and allowing the solid dopant material to diffuse into the perovskite material. In an embodiment, step 1012 is a form of the doping by solid diffusion according to step 1004.

STATEMENTS REGARDING INCORPORATION BY REFERENCE AND VARIATIONS

U.S. Pat. No. 9,583,724 discloses additional features, including blade coating processes, perovskite solution materials, and other device layer materials, and is hereby incorporated by reference in its entirety.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the disclosed subject matter (especially in the context of the following claims) are to be construed to cover both the singular and the plural, unless otherwise indicated herein or clearly contradicted by context. The use of the term "at least one" followed by a list of one or more items (for example, "at least one of A, B and C") is to be construed to mean one item selected from the listed items (A or B or C) or any combination of two or more of the listed items (A and B, or A and C, or B and C, or A and B and C), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein (e.g., recitation of a value "selected from the range of X to Y," in which X and Y are inclusive boundary values of the range). All methods described herein can be performed in any suitable order unless otherwise indicated herein or otherwise clearly contradicted by context. The use of any and all examples, or example language (e.g., "such as") provided herein, is intended merely to better illuminate the disclosed subject matter and does not pose a limitation on the scope of the invention unless otherwise claimed. No language in the specification should be construed as indicating any non-claimed element as essential to the practice of the invention.

Every device, system, composition, formulation, combination of components, or method described or exemplified herein can be used to practice the embodiments, unless otherwise stated.

When a group of substituents is disclosed herein, it is understood that all individual members of that group and all subgroups, including variations of a coating method (e.g., slot die coating, extrusion coating, curtain coating, slide coating, slot die coating, slot die bead coating, and tensioned-web slotdie coating), and including any isomers, enantiomers, and diastereomers of the group members are disclosed separately. When a Markush group or other grouping is used herein, all individual members of the group and all combinations and subcombinations possible of the group are intended to be individually included in the disclosure. When a compound is described herein such that a particular isomer, enantiomer or diastereomer of the compound is not specified, for example, in a formula or in a chemical name, that description is intended to include each isomers and enantiomer of the compound described individual or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compounds differently.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

One of ordinary skill in the art will appreciate that starting materials, reagents, synthetic methods, purification methods, analytical methods, photoactive device configurations (e.g., electrode configurations of photovoltaic cell), and photovoltaic cell measurements, other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

Certain embodiments are described herein. Variations of those embodiments may become apparent to those of ordinary skill in the art upon reading the foregoing description. The inventors expect skilled artisans to employ such variations as appropriate, and the inventors intend for the embodiments to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

The invention claimed is:

1. A method of forming a photoactive device containing a single photoactive layer, the method comprising steps of:
    forming the single photoactive layer, the photoactive layer comprising a perovskite material and a dopant; wherein the step of forming comprises coating a perovskite-dopant solution onto a receiving surface of a substrate; wherein the perovskite-dopant solution comprises at least a perovskite ink and a dopant; wherein the perovskite-dopant solution comprises one or more additives; wherein the photoactive layer comprises crystalline grains characterized by an average physical dimension selected from the range of 1000 nm to 2000 nm; wherein a concentration of the dopant in the photoactive layer is selected from the range of 0.01 wt. % to 0.05 wt. %; wherein the dopant is a p-type dopant;
    wherein the one or more additives comprise methylammonium hypophosphite (MHP) having a concentration in the solution selected from the range of 0.01 wt. % to 10 wt. %.;
    wherein the step of forming comprises doping the perovskite material with the dopant by solid diffusion;
    wherein doping by solid diffusion comprises providing a perovskite material free of the dopant in proximity with a solid dopant material and allowing the solid dopant material to diffuse into the perovskite material;
    wherein the photoactive device comprises a positive electrode and a negative electrode;
    wherein said photoactive layer is in electronic communication with the positive electrode and in electronic communication with the negative electrode;
    wherein the photoactive device is free of a hole transport layer between the photoactive layer and the positive electrode;
    wherein the photoactive device comprises an electron transport layer between the photoactive layer and the negative electrode; and
    wherein the photoactive device does not contain multiple photoactive layers, and the single photoactive layer is in contact with the electron transport layer.

2. The method of claim 1, comprising preparing the perovskite-dopant solution by combining at least: the perovskite ink, the dopant, and one or more solvents.

3. The method of claim 1, the step of coating comprising doctor blading.

4. The method of claim 1, wherein at least a portion of the photoactive layer is in direct physical contact with the positive electrode.

5. The method of claim 1, wherein at least one of the substrate and the receiving surface of the substrate is at least a portion of the positive electrode.

6. The method of claim 1, wherein the dopant comprises 2,3,5,6-tetrafluoro-7,7,8,8-tetracyanoquinodimethane (F4TCNQ).

7. The method of claim 1, wherein the positive electrode is a transparent electrical conductor.

8. The method of claim 1, wherein a total concentration of the one or more additives in the perovskite-dopant solution is selected from the range of 0.075 wt. % to 0.8 wt. %.

9. The method of claim 1, wherein the perovskite material is characterized by a chemical formula comprising at least two chemical species selected from the group consisting of Pb, Sn, Sb, Fe, Ge, Mn, Mo, Ta, Ag, Na, K, Ru, Cs, formamidinium ("FA"), methylammonium ("MA"), ethylammonium, propylammonium, butylammonium, amylammonium, hexylammonium, heptylammonium, octylammonium, oleylammonium, formamidinium, dodecylammonium, phenylethylammonium, benzylammonium, ethylenediammonium, tetramethylammonium, tetraethylammonium, tetrabutylammonium, hexadecyl trimethyl ammonium, and ethanediammonium, and at least one chemical species selected from the group consisting of I, Br, Cl, F, COO, BF3 and SCN.

10. The method of claim 1, wherein the photoactive device is a photovoltaic cell.

11. The method of claim 10, wherein an average photovoltaic efficiency of the photoactive device is greater by a factor of 1.8 to 2.2 times than an average photovoltaic efficiency of an otherwise equivalent photovoltaic cell free of the dopant.

12. The method of claim 1, wherein the photoactive device is free of an undoped perovskite layer.

13. The method of claim 1, wherein the positive electrode is in contact with the photoactive layer, the photoactive layer is in contact with the electron transport layer, and the electron transport layer is in contact with the negative electrode.

14. The method of claim 1, wherein the electron transport layer comprises $C_{60}$ and/or bathocuproine.

15. The method of claim 1, wherein a total concentration of the one or more additives in the perovskite-dopant solution is selected from the range of 0.225 wt. % to 1 wt. %.

16. The method of claim 1, wherein the dopant comprises 2,3,5,6-tetrafluoro-7,7,8,8-tetracyanoquinodimethane (F4TCNQ) and wherein the one or more additives comprise methylammonium hypophosphite (MHP).

17. The method of claim 1, wherein a total concentration of the one or more additives in the perovskite-dopant solution is selected from the range of 0.01 wt. % to 0.35 wt. %.

* * * * *